(12) United States Patent
Oh et al.

(10) Patent No.: US 11,569,265 B2
(45) Date of Patent: Jan. 31, 2023

(54) THREE-DIMENSIONAL MEMORY DEVICE AND MANUFACTURING METHOD THEREOF

(71) Applicant: SK hynix Inc., Icheon-si (KR)

(72) Inventors: Sung Lae Oh, Icheon-si (KR); Jin Ho Kim, Icheon-si (KR); Sang Woo Park, Icheon-si (KR); Sang Hyun Sung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 174 days.

(21) Appl. No.: 17/145,229

(22) Filed: Jan. 8, 2021

(65) Prior Publication Data

US 2022/0020764 A1 Jan. 20, 2022

(30) Foreign Application Priority Data

Jul. 20, 2020 (KR) ........................ 10-2020-0089546

(51) Int. Cl.
| | |
|---|---|
| *H01L 27/11582* | (2017.01) |
| *H01L 23/522* | (2006.01) |
| *H01L 21/768* | (2006.01) |
| *H01L 27/11556* | (2017.01) |
| *H01L 23/528* | (2006.01) |

(52) U.S. Cl.
CPC .. *H01L 27/11582* (2013.01); *H01L 21/76816* (2013.01); *H01L 21/76877* (2013.01); *H01L 23/5226* (2013.01); *H01L 23/5283* (2013.01); *H01L 27/11556* (2013.01)

(58) Field of Classification Search
None
See application file for complete search history.

(56) References Cited

U.S. PATENT DOCUMENTS

2021/0391258 A1\* 12/2021 Kim .................. H01L 21/76892

FOREIGN PATENT DOCUMENTS

| KR | 10-2020-0007212 A | 1/2020 |
|---|---|---|
| KR | 10-2020-0088988 A | 7/2020 |
| KR | 10-2022-0010874 A | 1/2022 |

\* cited by examiner

*Primary Examiner* — Hsien Ming Lee

(57) ABSTRACT

A three-dimensional memory device includes an electrode structure including a plurality of electrode layers and a plurality of interlayer dielectric layers which are alternately stacked on a substrate; a first stairway structure and a second stairway structure defined in the electrode structure, and positioned at different heights from each other; a sidewall of the electrode structure formed due to a difference in height between the first stairway structure and the second stairway structure; and a dielectric support passing through the electrode structure, and isolating a corner portion of the sidewall from the plurality of electrode layers.

20 Claims, 36 Drawing Sheets

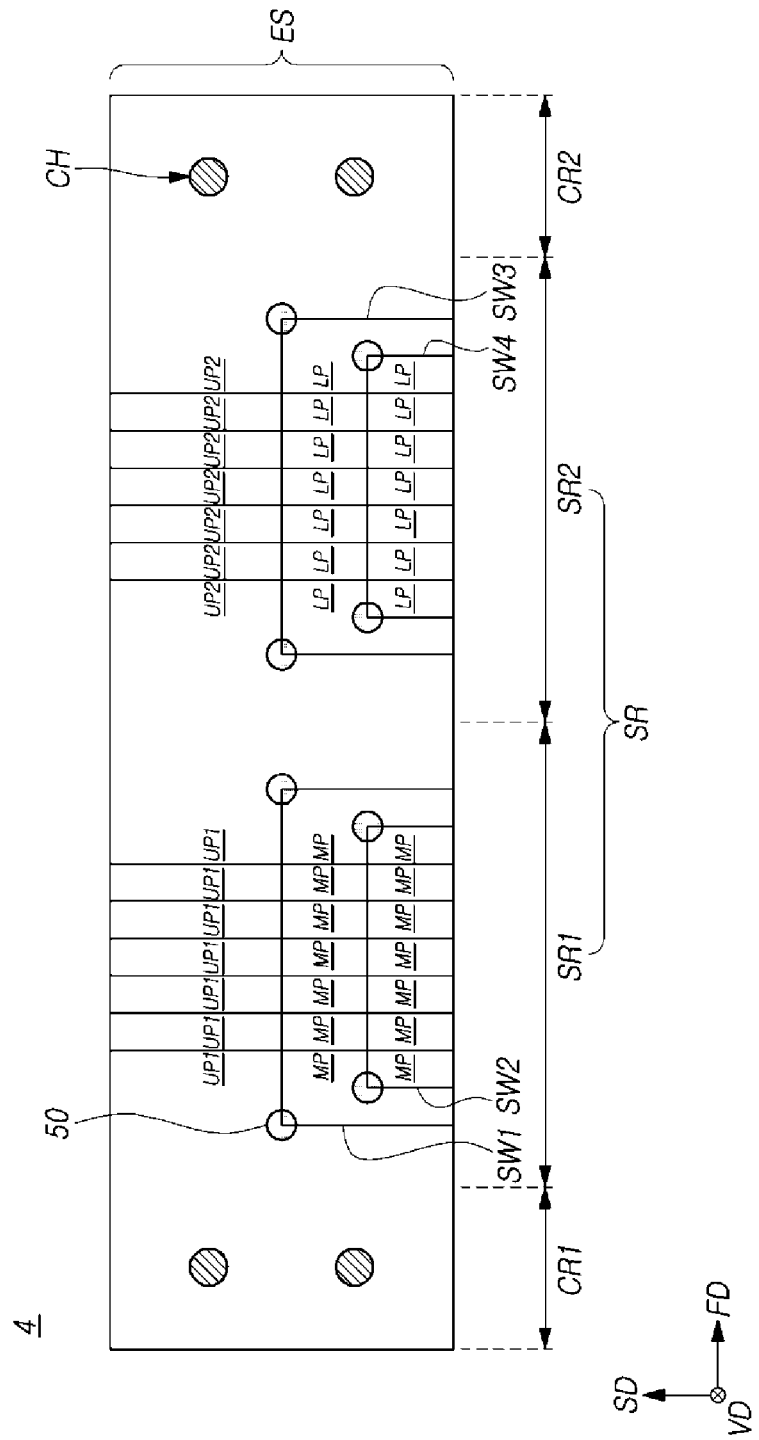

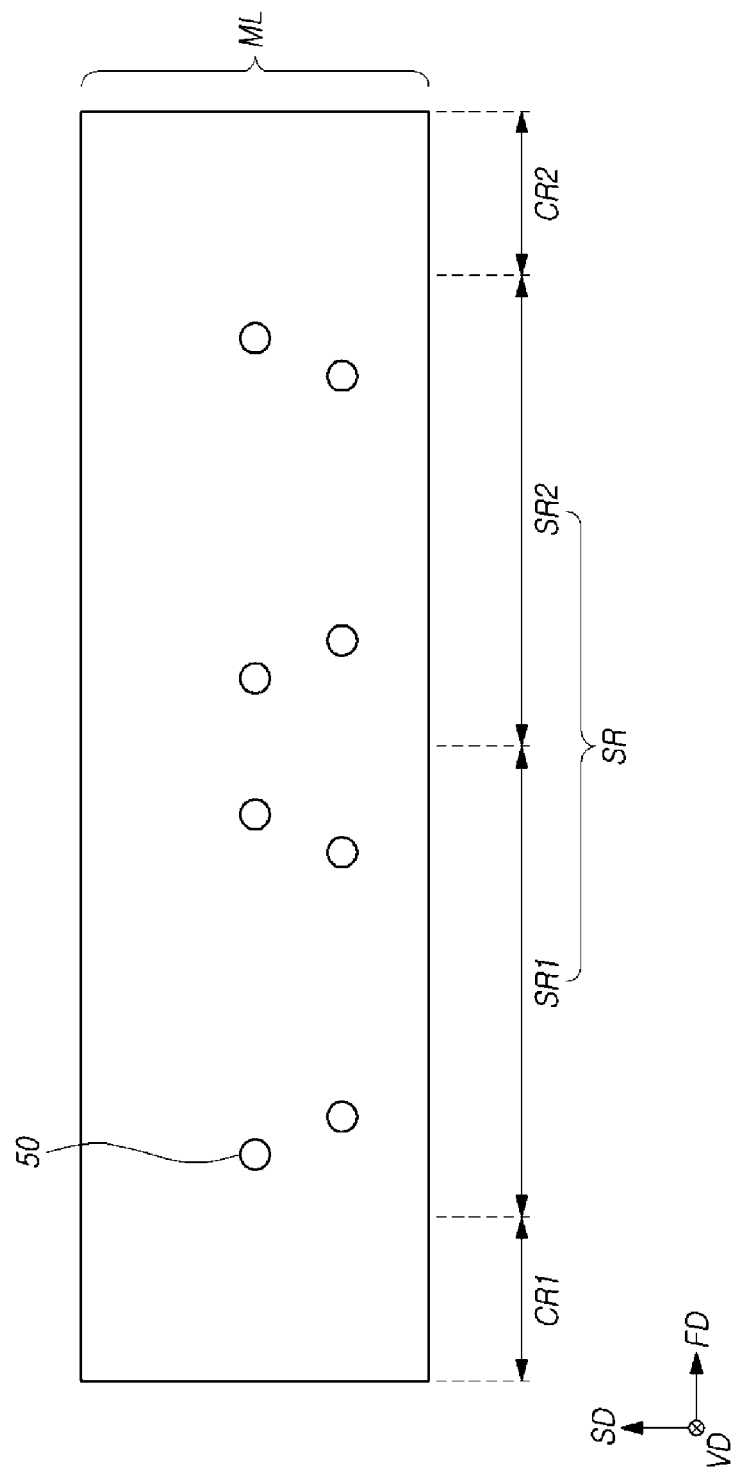

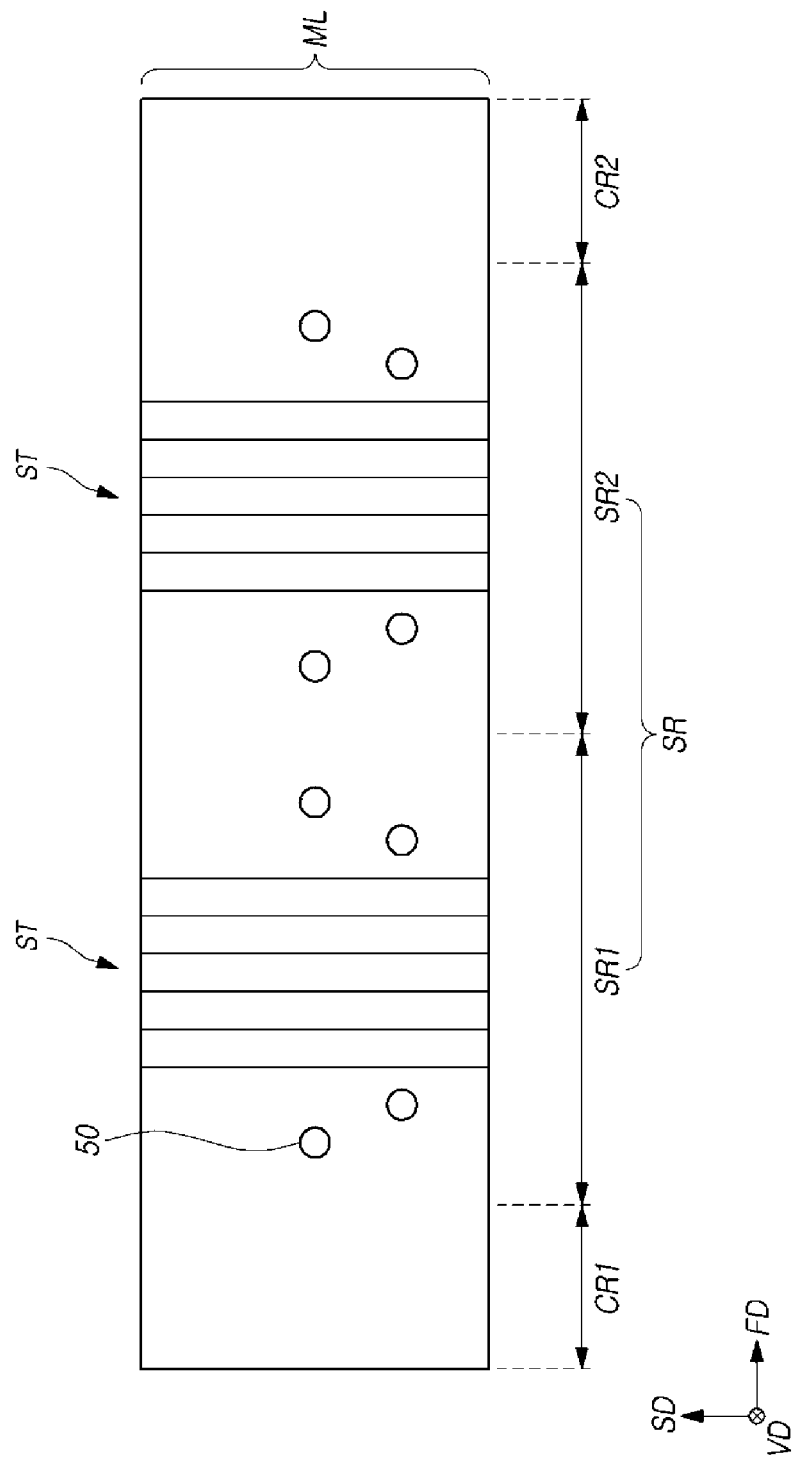

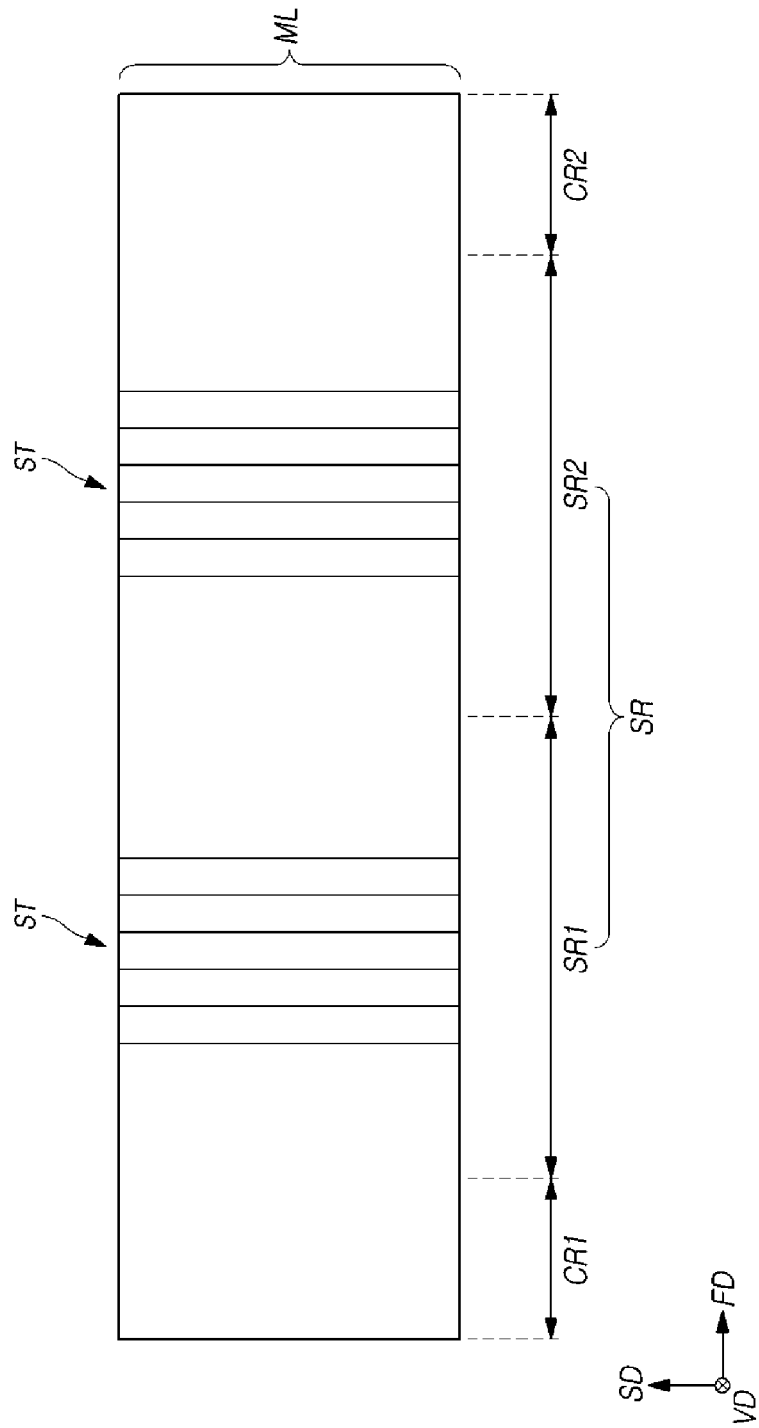

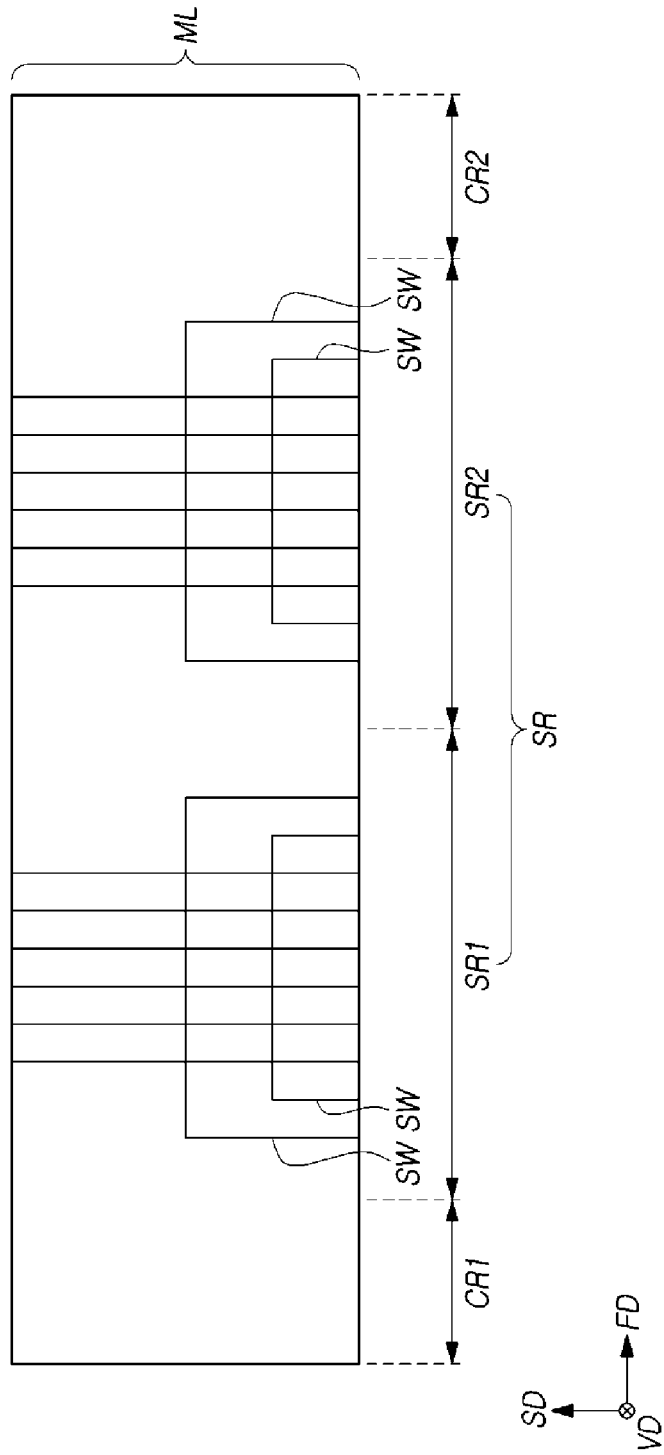

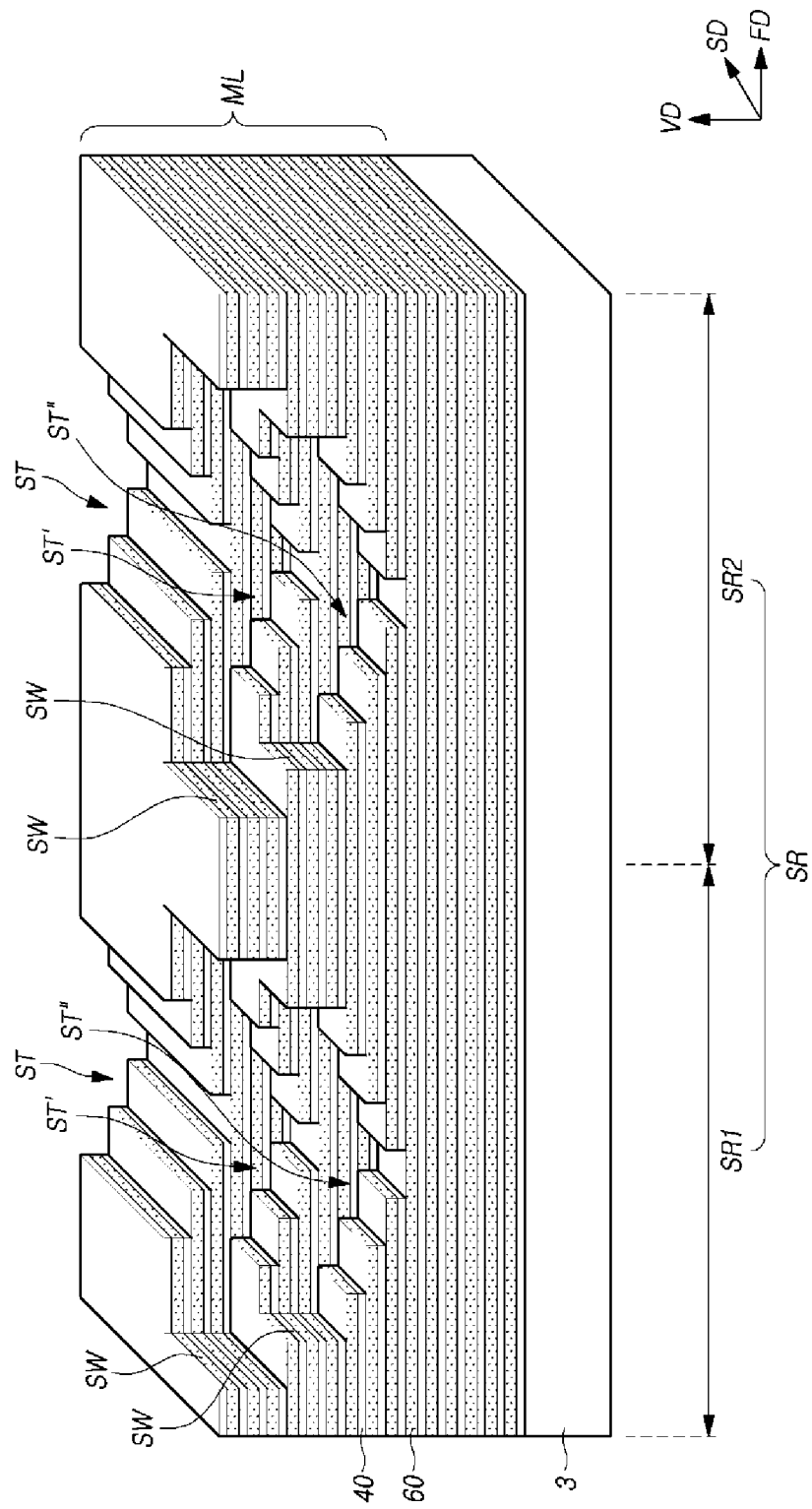

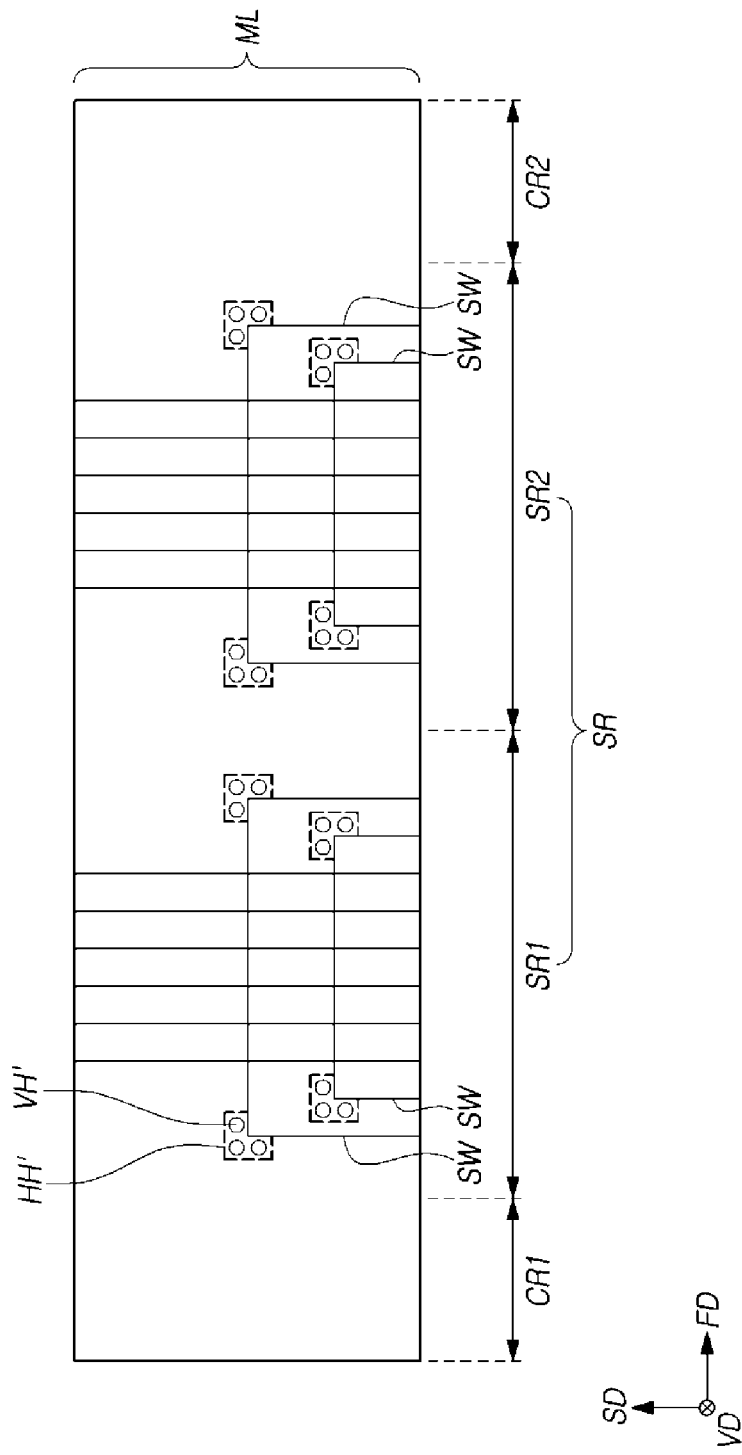

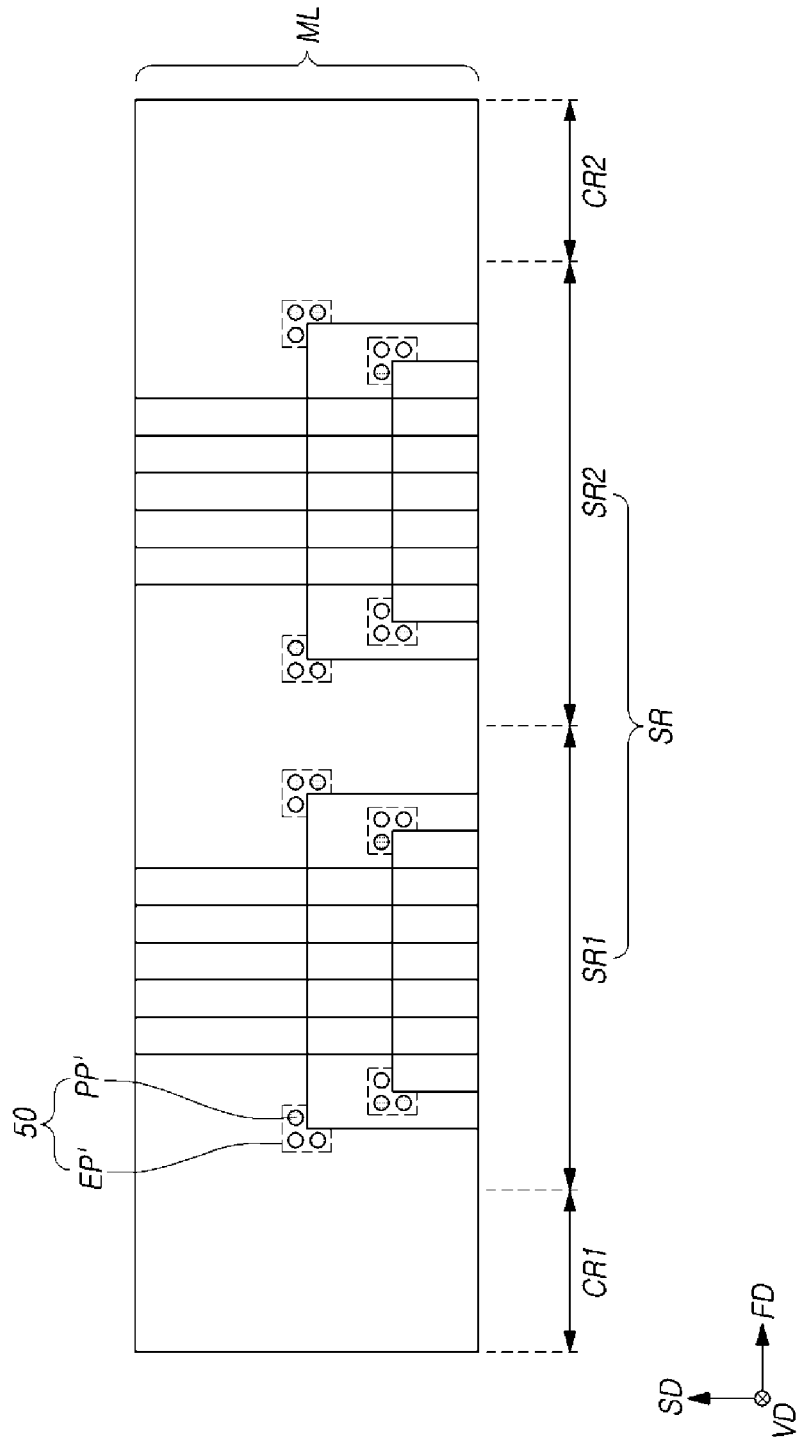

THREE-DIMENSIONAL MEMORY DEVICE AND MANUFACTURING METHOD THEREOF

CROSS-REFERENCE TO RELATED APPLICATION

The present application claims priority under 35 U.S.C. § 119(a) to Korean Patent Application No. 10-2020-0089546 filed in the Korean Intellectual Property Office on Jul. 20, 2020, which is incorporated herein by reference in its entirety.

BACKGROUND

1. Technical Field

Various embodiments generally relate to a semiconductor technology, and particularly, to a three-dimensional memory device and a manufacturing method thereof.

2. Related Art

In order to meet excellent performance and low price that consumers demand, it is required to increase the degree of integration of a memory device. The degree of integration of a two-dimensional or planar memory device is mainly determined by the area occupied by a unit memory cell, so the degree of integration is greatly influenced by the level of a fine pattern forming technique. However, because substantially expensive equipment is needed for the formation of a fine pattern, the degree of integration of a two-dimensional memory device is still limited although it is increasing. As an alternative to overcome such a limitation, a three-dimensional memory device including three-dimensionally arranged memory cells has been proposed. In the three-dimensional memory device, the degree of integration may be increased by increasing the stack number of electrode layers that are coupled to the memory cells.

SUMMARY

Various embodiments are directed to measures capable of contributing to reducing a failure of a three-dimensional memory device.

In an embodiment, a three-dimensional memory device may include: an electrode structure including a plurality of electrode layers and a plurality of interlayer dielectric layers, which are alternately stacked on a substrate; a first stairway structure and a second stairway structure defined in the electrode structure, and positioned at different heights from each other; a sidewall of the electrode structure between the first stairway structure and the second stairway structure; and a dielectric support passing through the electrode structure, and isolating a corner portion of the sidewall from the plurality of electrode layers.

In an embodiment, a method for manufacturing a three-dimensional memory device may include: forming a pre-stack by alternately stacking a plurality of interlayer dielectric layers and a plurality of sacrificial layers on a substrate; forming a dielectric support, which passes through the pre-stack; forming a first stairway structure on a top of the pre-stack in a slimming region; forming a second stairway structure by transferring a part of the first stairway structure downward by etching the pre-stack; and substituting the sacrificial layers with electrode layers. In the forming of the second stairway structure, a corner portion of a sidewall that is formed in the pre-stack by the etching may be isolated from the plurality of sacrificial layers by the dielectric support.

In an embodiment, a method for manufacturing a three-dimensional memory device may include: forming a pre-stack by alternately stacking a plurality of interlayer dielectric layers and a plurality of sacrificial layers on a substrate; forming a first stairway structure on a top of the pre-stack; forming a second stairway structure by transferring a part of the first stairway structure downward by etching the pre-stack; forming a vertical hole which passes through the pre-stack, in the vicinity of a corner portion of a sidewall, which is formed in the pre-stack in the forming of the second stairway structure; forming a plurality of horizontal grooves by removing the plurality of sacrificial layers, formed at the corner portion, through the vertical hole; forming a dielectric support in the vertical hole and the plurality of horizontal grooves; and substituting the sacrificial layers with electrode layers.

BRIEF DESCRIPTION OF THE DRAWINGS

FIG. 4 is a top view illustrating a representation of an electrode structure of a three-dimensional memory device in accordance with an embodiment of the disclosure.

FIGS. 6A to 9A are representations of top views to assist in the explanation of steps of manufacturing a three-dimensional memory device in accordance with an embodiment of the disclosure.

FIGS. 6B to 9B are representations of perspective views to assist in the explanation of steps of manufacturing a three-dimensional memory device in accordance with an embodiment of the disclosure.

FIGS. 16A to 21B are representations of views to assist in the explanation of a method for manufacturing a three-dimensional memory device including the dielectric support illustrated in FIGS. 14 and 15.

DETAILED DESCRIPTION

Figure 1:
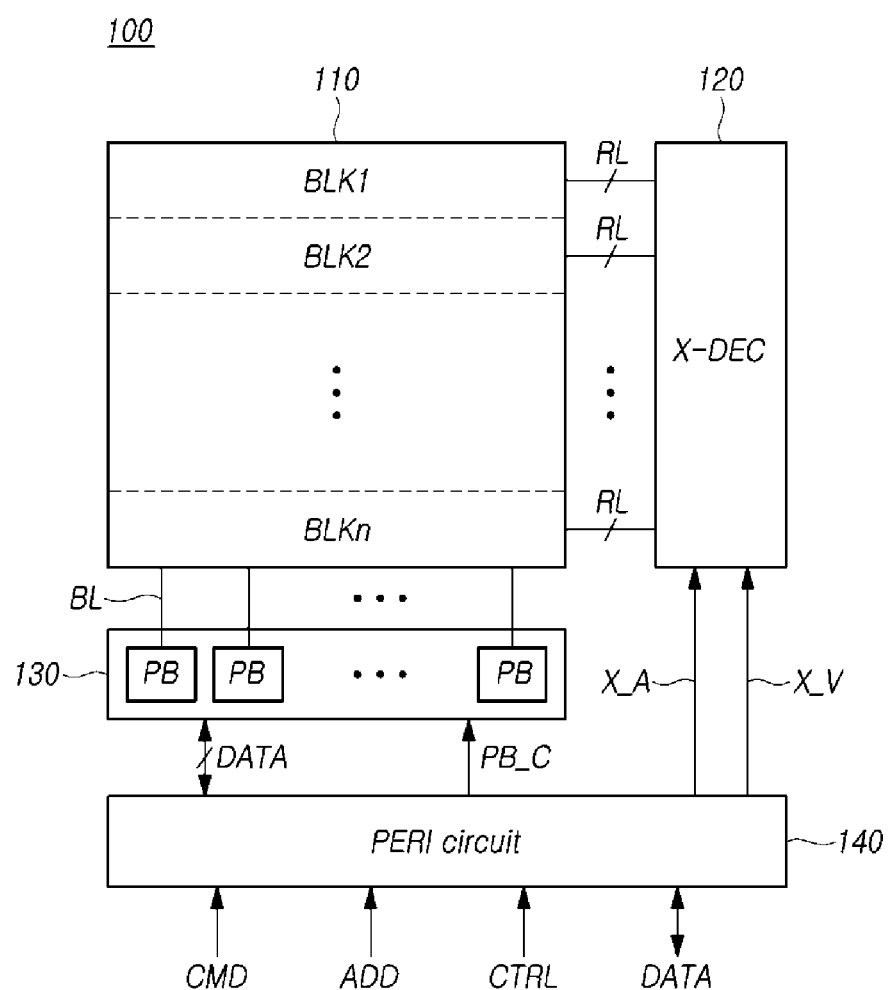
FIG. 1 is a block diagram illustrating a representation of a three-dimensional memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise. In interpreting components in embodiments of the disclosure, they should be interpreted as including error margins in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it should be understood that the component may be directly "connected," "coupled" or "linked" to the another embodiment but still another component may be "interposed" therebetween or the component may be "connected," "coupled" or "linked" to the another component via a still another component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

FIG. 1 is a block diagram illustrating a representation of a three-dimensional memory device in accordance with an embodiment of the disclosure.

Referring to FIG. 1, a memory device 100 in accordance with an embodiment of the disclosure may include a memory cell array 110, a row decoder 120, a page buffer circuit 130, and a peripheral circuit 140.

The memory cell array 110 may include a plurality of memory blocks BLK1 to BLKn. Although not illustrated, each of the memory blocks BLK1 to BLKn may include a plurality of memory cells. A memory cell may be accessed by a word line and a bit line. The memory cells may be volatile memory cells that lose data stored therein if power supply is interrupted, or may be nonvolatile memory cells that retain data stored therein even though power supply is interrupted. While it is described below that the memory device 100 is a vertical type NAND flash device, it is to be noted that the technical spirit of the disclosure is not limited thereto.

The row decoder 120 may be coupled to a memory cell array 110 through row lines RL. The row lines RL may include at least one drain select line, a plurality of word lines, and at least one source select line. The row decoder 120 may select one from among the memory blocks BLK1 to BLKn of the memory cell array 110 depending on address information. The row decoder 120 may transfer an operating voltage X_V from the peripheral circuit 140, for example, a program voltage, a pass voltage and a read voltage, to the row lines RL coupled to a selected memory block. In order to transfer the operating voltage X_V, the row decoder 120 may include a plurality of pass transistors, which are coupled to the row lines RL, respectively.

The page buffer circuit 130 may be coupled to the memory cell array 110 through bit lines BL. The page buffer circuit 130 may include a plurality of page buffers PB, which are coupled to the bit lines BL, respectively. The page buffer circuit 130 may receive a page buffer control signal PB_C from the peripheral circuit 140, and may transmit and receive a data signal DATA to and from the peripheral circuit 140.

The page buffer circuit 130 may control the bit line BL, which is coupled to the memory cell array 110, in response to the page buffer control signal PB_C. For example, the page buffer circuit 130 may detect data, stored in a memory cell of the memory cell array 110, by sensing the signal of the bit line BL of the memory cell array 110 in response to the page buffer control signal PB_C, and may transmit the data signal DATA to the peripheral circuit 140 depending on the detected data. The page buffer circuit 130 may apply a signal to the bit line BL based on the data signal DATA received from the peripheral circuit 140 in response to the page buffer control signal PB_C, and thereby, may write data in a memory cell of the memory cell array 110. The page buffer circuit 130 may write data in or read data from a memory cell, which is coupled to a word line activated by the row decoder 120.

The peripheral circuit 140 may receive a command signal CMD, an address signal ADD and a control signal CTRL from outside the memory device 100, and may transmit and receive data DATA to and from a device outside the memory device 100, for example, a memory controller. The peripheral circuit 140 may output signals for writing data DATA in the memory cell array 110 or reading data DATA from the memory cell array 110, for example, a row address X_A, the page buffer control signal PB_C and so forth, based on the command signal CMD, the address signal ADD and the control signal CTRL. The peripheral circuit 140 may generate various voltages including the operating voltage X_V, which are required in the memory device 100.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may correspond to the extending direction of word lines and the arrangement direction of bit lines, and the second direction SD may correspond to the extending direction of the bit lines and the arrangement direction of the word lines. The first direction FD and the second direction SD may substantially perpendicularly intersect with each other. The first direction FD and the second direction SD may be orthogonal to the vertical direction VD. In the drawings, a direction indicated by an arrow and a direction opposite thereto represent the same direction.

Figure 2:
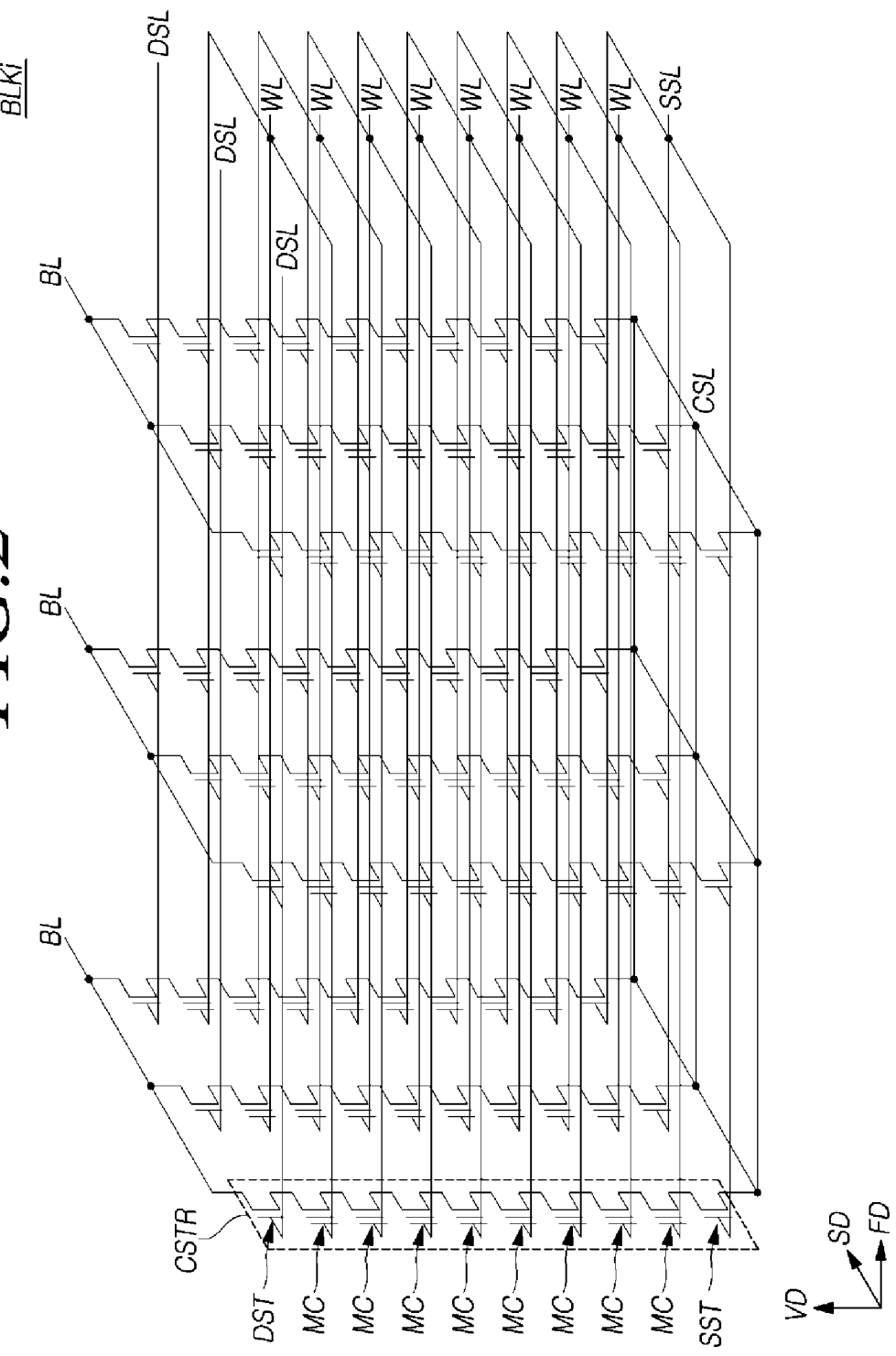
FIG. 2 is an equivalent circuit diagram illustrating a representation of a memory block illustrated in FIG. 1.

FIG. 2 is an equivalent circuit diagram illustrating a representation of a memory block illustrated in FIG. 1.

Referring to FIG. 2, a memory block BLKi may include a plurality of cell strings CSTR, which are coupled between a plurality of bit lines BL and a common source line CSL. The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST, which is coupled to the bit line BL, a source select transistor SST, which is coupled to the common source line CSL, and a plurality of memory cells MC, which are coupled between the drain select transistor DST and the source select transistor SST. The drain select transistor DST, the memory cells MC and the source select transistor SST may be coupled in series in the vertical direction VD.

Drain select lines DSL, a plurality of word lines WL and a source select line SSL may be stacked between the bit lines BL and the common source line CSL in the vertical direction VD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST.

Memory cells MC included in memory blocks BLKi may be divided into physical page units or logical page units. For example, memory cells MC that share one word line WL and are coupled to different cell strings CSTR may configure one physical page. Such a page may be the basic unit of a read operation.

Figure 3A:
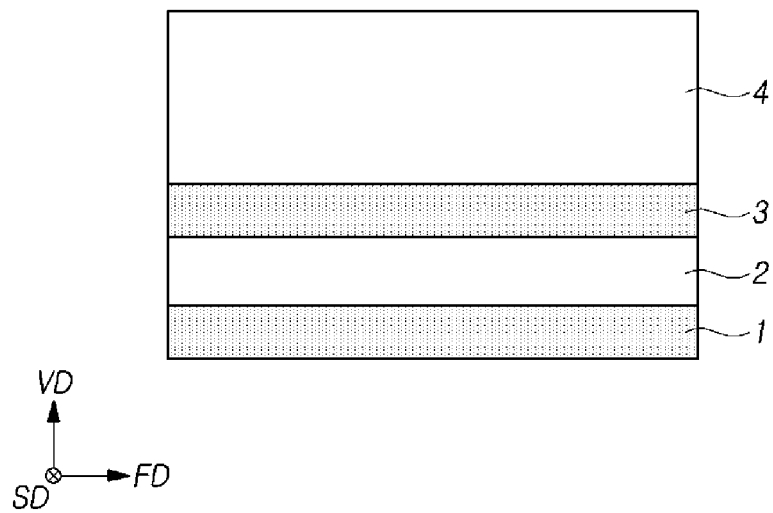
FIGS. 3A and 3B are cross-sectional views illustrating representations of schematic layouts of three-dimensional memory devices in accordance with embodiments of the disclosure.
Figure 3B:
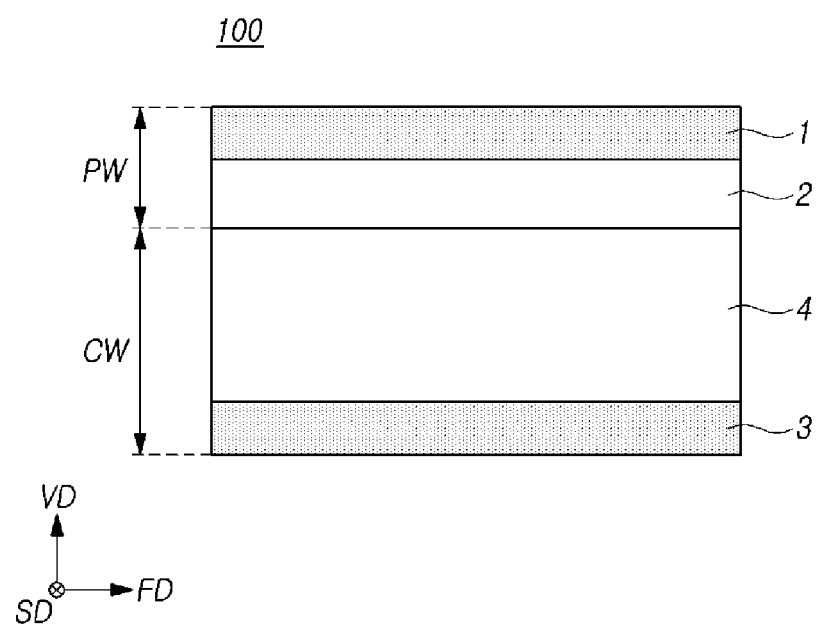

FIGS. 3A and 3B are cross-sectional views illustrating representations of schematic layouts of three-dimensional memory devices in accordance with embodiments of the disclosure.

Referring to FIG. 3A, a three-dimensional memory device 100 in accordance with an embodiment of the disclosure may include a first substrate 1, a logic structure 2 that is disposed on the first substrate 1, a second substrate 3 that is disposed on the logic structure 2, and a memory structure 4 that is disposed on the second substrate 3. The logic structure 2 may include the row decoder 120, the page buffer circuit 130 and the peripheral circuit 140 of FIG. 1, and the memory structure 4 may include the memory cell array 110 of FIG. 1. The memory device 100 of FIG. 3A may have a PUC (peri under cell) structure.

Referring to FIG. 3B, a three-dimensional memory device 100 in accordance with an embodiment of the disclosure may include a cell wafer CW, and a peripheral wafer PW that is bonded onto the cell wafer CW. The peripheral wafer PW may include a first substrate 1 and a logic structure 2 that is disposed on the first substrate 1. The cell wafer CW may include a second substrate 3 and a memory structure 4, which is disposed on the second substrate 3.

The memory structure 4 may include the memory cell array 110 of FIG. 1, and the logic structure 2 may include the row decoder 120, the page buffer circuit 130 and the peripheral circuit 140 of FIG. 1. After the peripheral wafer PW is turned upside down such that the logic structure 2 faces the memory structure 4, the peripheral wafer PW may be bonded onto the cell wafer CW. The memory device 100 of FIG. 3B may have a POC (peri over cell) structure.

Figure 5:
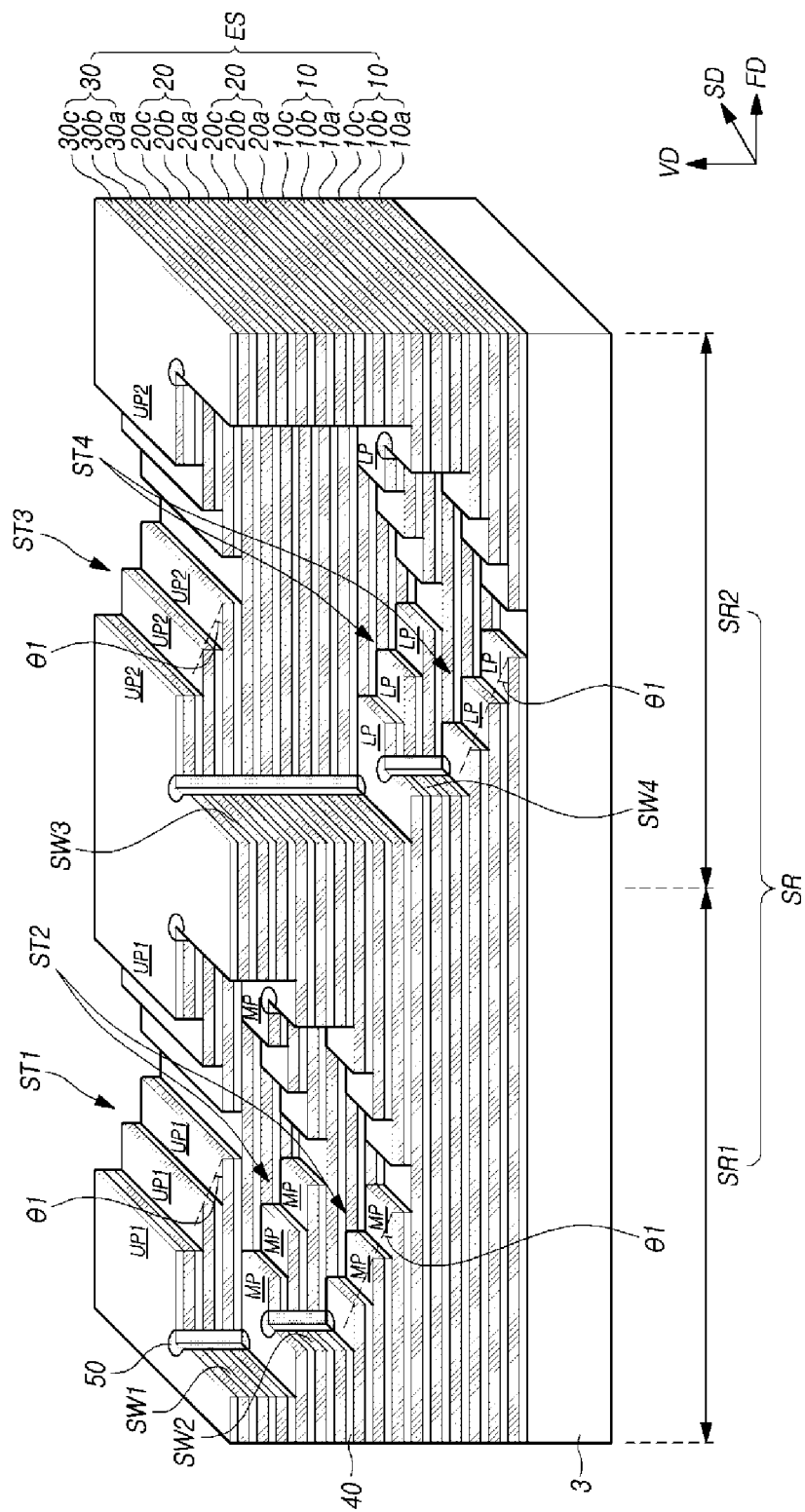
FIG. 5 is a perspective view illustrating a representation of a part of FIG. 4.

FIG. 4 is a top view illustrating a representation of an electrode structure of a three-dimensional memory device in accordance with an embodiment of the disclosure, and FIG. 5 is a perspective view illustrating a representation of a part of FIG. 4.

Referring to FIGS. 4 and 5, a memory structure 4 or a substrate 3 may include a first cell region CR1, a slimming region SR, which extends from the first cell region CR1 in the first direction FD, and a second cell region CR2, which extends from the slimming region SR in the first direction FD. The slimming region SR may include a first region SR1 and a second region SR2, which are disposed in a line in the first direction FD. While the present embodiment illustrates the slimming region SR with two regions, it is to be noted that the slimming region SR may be configured as a single region or may include at least three regions, which are disposed in a line in the first direction FD.

The substrate 3 may include at least one from among silicon (Si), germanium (Ge), silicon germanium (SiGe), gallium arsenide (GaAs), indium gallium arsenide (InGaAs), aluminum gallium arsenide (AlGaAs) and a compound thereof. The substrate 3 may be a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG).

The memory structure 4 may include an electrode structure ES, which is disposed on the substrate 3. The electrode structure ES may extend in the first direction FD, and may traverse the first cell region CR1, the slimming region SR and the second cell region CR2. The electrode structure ES may configure a memory block (one of BLK1 to BLKn in FIG. 1). Although not illustrated, a plurality of electrode structures may be arranged in the second direction SD, and thereby, may configure a memory cell array (110 of FIG. 1).

The electrode structure ES may include a plurality of electrode layers 10a to 10c, 20a to 20c and 30a to 30c and a plurality of interlayer dielectric layers 40 which are alternately stacked on the substrate 3 in the vertical direction VD.

The electrode layers 10a to 10c, 20a to 20c and 30a to 30c may include a conductive material. For example, the electrode layers 10a to 10c, 20a to 20c and 30a to 30c may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 10a to 10c, 20a to 20c and 30a to 30c, at least one electrode layer from a lowermost electrode layer may configure a source select line. Among the electrode layers 10a to 10c, 20a to 20c and 30a to 30c, at least one electrode layer from an uppermost electrode layer may configure a drain select line. Electrode layers between the source select line and the drain select line may configure word lines. The interlayer dielectric layers 40 may be formed of an oxide, such as for example, silicon oxide.

A plurality of vertical channels CH, which pass through the plurality of electrode layers 10a to 10c, 20a to 20c and 30a to 30c and the plurality of interlayer dielectric layers 40 in the vertical direction VD may be defined in the first and second cell regions CR1 and CR2.

Each of the vertical channels CH may include a channel layer and a gate dielectric layer. The channel layer may include polysilicon or single crystal silicon, and may include, in some regions thereof, a p-type impurity such as boron (B). The channel layer may have the shape of a pillar that is completely filled up to its center, or a solid cylinder. While not illustrated, the channel layer may have the shape of a tube whose center region is open. In this example, a buried dielectric layer may be formed in the open center region of the channel layer. The gate dielectric layer may have the shape of a straw or a cylindrical shell that surrounds the outer wall of the channel layer. Although not illustrated, the gate dielectric layer may include a tunnel dielectric layer, a charge storage layer and a blocking layer, which are sequentially stacked from the outer wall of the channel layer. The gate dielectric layer may have an ONO (oxide-nitride-oxide) stack structure in which an oxide layer, a nitride layer and an oxide layer are sequentially stacked.

The electrode structure ES may include lower stacks 10, intermediate stacks 20 that are stacked on the lower stacks 10, and an upper stack 30 that is stacked on the intermediate stacks 20.

The upper stack 30 may include a plurality of upper electrode layers 30a to 30c, which are stacked alternately with interlayer dielectric layers 40, in the vertical direction VD. The number of upper electrode layers that configure the upper stack 30 may be k (where k is a natural number of two (2) or greater). The present embodiment illustrates the upper stack 30 with three upper electrode layers 30a to 30c.

In the first region SR1, a portion of each of the upper electrode layers 30a to 30c may be exposed. In the first region SR1, each of the upper electrode layers 30a to 30c may have a first upper pad region UP1, which is exposed by an upper electrode layer positioned thereon. The first upper pad regions UP1 of the upper electrode layers 30a to 30c may be disposed in a stepwise manner in the first direction FD. A first stairway structure ST1 may be formed in the upper stack 30 by the first upper pad regions UP1 of the upper electrode layers 30a to 30c. The first stairway structure ST1 may have a first inclination angle θ1 with respect to the top surface of the substrate 3. The present embodiment illustrates the first stairway structure ST1 with a stairway shape that gradually ascends from the center portion of the first stairway structure ST1 to both sides of the first stairway structure ST1 in the first direction FD.

In the first region SR1, the upper stack 30 may expose a part of each of the intermediate stacks 20. In the first region SR1, an upper intermediate stack 20 may expose a part of a lower intermediate stack 20, which is positioned below the upper intermediate stack 20.

Each of the intermediate stacks 20 may include a plurality of intermediate electrode layers 20a to 20c, which are stacked alternately with interlayer dielectric layers 40 in the vertical direction VD. The number of intermediate electrode layers that configure each intermediate stack 20 may be m (where m is a natural number of 2 or greater). The present embodiment illustrates each intermediate stack 20 with three intermediate electrode layers 20a to 20c.

In the first region SR1, portions of the intermediate electrode layers 20a to 20c of each intermediate stack 20 may be exposed. In the first region SR1, each of the intermediate electrode layers 20a to 20c may have an intermediate pad region MP, which is exposed by an intermediate electrode layer positioned thereon. In each intermediate stack 20, the intermediate pad regions MP of the intermediate electrode layers 20a to 20c may be disposed in a stepwise manner in the first direction FD. A second stairway structure ST2 may be formed in each intermediate stack 20 by the intermediate pad regions MP of the intermediate electrode layers 20a to 20c. The second stairway structure ST2 may have the first inclination angle θ1 with respect to the top surface of the substrate 3.

The second stairway structure ST2 may have the same shape as the first stairway structure ST1. If the first stairway structure ST1 has a stairway shape that gradually ascends from the center portion of the first stairway structure ST1 to both sides of the first stairway structure ST1 in the first direction FD, then the second stairway structure ST2 may also have a stairway shape that gradually ascends from the center portion of the second stairway structure ST2 to both sides of the second stairway structure ST2 in the first direction FD.

The first stairway structure ST1 of the upper stack 30 and the second stairway structures ST2 of the intermediate stacks 20 may be arranged in the second direction SD when viewed from the top, and may be positioned at different heights from one another. For example, the first stairway structure ST1 of the upper stack 30 may be farthest from the substrate 3, and the second stairway structures ST2 of the intermediate stacks 20 may be closer to the substrate 3 as a distance from the first stairway structure ST1 in the second direction SD increases.

When viewed from the top, the upper electrode layers 30a to 30c of the upper stack 30 may be divided in the first region SR1 to form both sides of the first stairway structure ST1, and to expose both sides of the second stairway structures ST2. A part of each intermediate stack 20, however, may overlap with the first stairway structure ST1 in the vertical direction VD. Due to the presence of the part that overlaps with the first stairway structure ST1 in the vertical direction VD, the intermediate electrode layers 20a to 20c of the intermediate stack 20 are not divided in the first region SR1.

In the first region SR1, a first sidewall SW1 and a second sidewall SW2 may be formed in the electrode structure ES. The first sidewall SW1 may couple the first stairway structure ST1 of the upper stack 30 and the second stairway structure ST2 of the uppermost intermediate stack 20. The height of the first sidewall SW1 may correspond to the difference between a vertical position of the top of the first stairway structure ST1 of the upper stack 30 and a vertical position of the top of the second stairway structure ST2 of the uppermost intermediate stack 20.

The second sidewall SW2 may couple the second stairway structure ST2 of the upper intermediate stack 20 positioned above and the second stairway structure ST2 of the lower intermediate stack 20 positioned below. The height of the second sidewall SW2 may correspond to the difference between a vertical position of the top of the second stairway structure ST2 of the upper intermediate stack 20 and a vertical position of the top of the second stairway structure ST2 of the lower intermediate stack 20.

For example, the height of each of the first sidewall SW1 and the second sidewall SW2 may be equal to or larger than twice the vertical pitch of the electrode layers (e.g., 10a to 10c, 20a to 20c and 30a to 30c). The vertical pitch of the electrode layers may be defined as the sum of a height of one electrode layer and a height of one interlayer dielectric layer 40. The present embodiment illustrates each of the first sidewall SW1 and the second sidewall SW2 with a height that is three times the vertical pitch of the electrode layers 10a to 10c, 20a to 20c and 30a to 30c.

In the second region SR2, portions of the upper electrode layers 30a to 30c may be exposed. In the second region SR2, each of the upper electrode layers 30a to 30c may have a second upper pad region UP2, which is exposed by an upper electrode layer positioned thereon. The second upper pad regions UP2 of the upper electrode layers 30a to 30c may be disposed in a stepwise manner in the first direction FD. A third stairway structure ST3 may be formed in the upper stack 30 by the second upper pad regions UP2 of the upper electrode layers 30a to 30c. The third stairway structure ST3 may have the first inclination angle θ1 with respect to the top surface of the substrate 3. The present embodiment illustrates the third stairway structure ST3 with a stairway shape that gradually ascends from the center portion of the third stairway structure ST3 to both sides of the third stairway structure ST3 in the first direction FD.

In the second region SR2, the upper stack 30 may expose a part of each of the lower stacks 10. In the second region SR2, the lower stack 10 which is posited above may expose a part of the lower stack 10, which is positioned below.

Each of the lower stacks 10 may include a plurality of lower electrode layers 10a to 10c, which are stacked alternately with the interlayer dielectric layers 40 in the vertical direction VD. The number of lower electrode layers that configure each lower stack 10 may be n (where n is a natural number of 2 or greater). The present embodiment illustrates each lower stack 10 with three lower electrode layers 10a to 10c.

In the second region SR2, portions of the lower electrode layers 10a to 10c of each lower stack 10 may be exposed. In the second region SR2, each of the lower electrode layers 10a to 10c may have a lower pad region LP, which is exposed by a lower electrode layer positioned thereon. In each lower stack 10, the lower pad regions LP of the lower electrode layers 10a to 10c may be disposed in a stepwise manner in the first direction FD. A fourth stairway structure ST4 may be formed in each lower stack 10 by the lower pad regions LP of the lower electrode layers 10a to 10c. The fourth stairway structure ST4 may have the first inclination angle θ1 with respect to the top surface of the substrate 3.

The fourth stairway structure ST4 may have the same shape as the third stairway structure ST3. If the third stairway structure ST3 has a stairway shape that gradually ascends from the center portion of the third stairway structure ST3 to both sides of the third stairway structure ST3 in the first direction FD, then the fourth stairway structure ST4 may also have a stairway shape that gradually ascends from the center portion of the fourth stairway structure ST4 to both sides of the fourth stairway structure ST4 in the first direction FD.

The third stairway structure ST3 of the upper stack 30 and the fourth stairway structures ST4 of the lower stacks 10 may be arranged in the second direction SD when viewed from the top, and may be positioned at different heights from one another. For example, the third stairway structure ST3 of the upper stack 30 may be farthest from the substrate 3, and the fourth stairway structures ST4 of the lower stacks 10 may be closer to the substrate 3 as a distance from the third stairway structure ST3 in the second direction SD increases.

When viewed from the top, the upper electrode layers 30a to 30c of the upper stack 30 may be divided in the second region SR2 to form both sides of the third stairway structure ST3, and to expose both sides of the fourth stairway structures ST4. A part of each lower stack 10, however, may overlap with the third stairway structure ST3 in the vertical direction VD. Due to the presence of the part that overlaps with the third stairway structure ST3 in the vertical direction VD, the lower electrode layers 10a to 10c of the lower stack 10 are not divided in the second region SR2.

A third sidewall SW3 and a fourth sidewall SW4 may be formed in the electrode structure ES in the second region SR2. The third sidewall SW3 may couple the third stairway structure ST3 of the upper stack 30 and the fourth stairway structure ST4 of the uppermost lower stack 10. The height of the third sidewall SW3 may correspond to the difference between a vertical position of the top of the third stairway structure ST3 of the upper stack 30 and a vertical position of the top of the fourth stairway structure ST4 of the uppermost lower stack 10.

The fourth sidewall SW4 may couple the fourth stairway structure ST4 of the lower stack 10 positioned above and the fourth stairway structure ST4 of the lower stack 10 positioned below. The height of the fourth sidewall SW4 may correspond to the difference between a vertical position of the top of the fourth stairway structure ST4 of the lower stack 10 positioned above and a vertical position of the top of the fourth stairway structure ST4 of the lower stack 10 positioned below.

For example, the height of each of the third sidewall SW3 and the fourth sidewall SW4 may be equal to or larger than twice the vertical pitch of the electrode layers (e.g., 10a to 10c, 20a to 20c and 30a to 30c). The vertical pitch of the electrode layers may be defined as the sum of a height of one electrode layer and a height of one interlayer dielectric layer 40. The present embodiment illustrates each of the third sidewall SW3 and the fourth sidewall SW4 with a height that is three times the vertical pitch of the electrode layers 10a to 10c, 20a to 20c and 30a to 30c.

In order to allow the first stairway structure ST1 and the second stairway structures ST2 to be locally formed in the first region SR1, each of the first sidewall SW1 and the second sidewall SW2 has at least one corner portion. Similarly, in order to allow the third stairway structure ST3 and the fourth stairway structures ST4 to be locally formed in the second region SR2, each of the third sidewall SW3 and the fourth sidewall SW4 has at least one corner portion.

Dielectric supports 50 may be formed at the corner portions of the first to fourth sidewalls SW1 to SW4, respectively, and thereby, may isolate the electrode layers 10a to 10c, 20a to 20c and 30a to 30c from the corner portions of the first to fourth sidewalls SW1 to SW4. Accordingly, the electrode layers 10a to 10c, 20a to 20c and 30a to 30c are not disposed at the corner portions of the first to fourth sidewalls SW1 to SW4.

The dielectric supports 50 may pass through the electrode structure ES at the corner portions. For example, the dielectric supports 50 may have the shapes of vertical pillars that pass through the electrode structure ES in the vertical direction VD. The dielectric supports 50 may be formed of an oxide, for example, silicon oxide.

Although the present embodiment illustrates the dielectric support 50 with a circular cross-sectional shape, the disclosure is not limited thereto. The cross-sectional shape of the dielectric support 50 may be a polygonal shape such as a triangle or quadrangle shape, or an elliptical shape.

FIGS. 6A to 9A are representations of top views to assist in the explanation of the steps of manufacturing a three-dimensional memory device in accordance with an embodiment of the disclosure, and FIGS. 6B to 9B are representations of perspective views to assist in the explanation of steps of manufacturing a three-dimensional memory device in accordance with an embodiment of the disclosure.

Figure 6B:
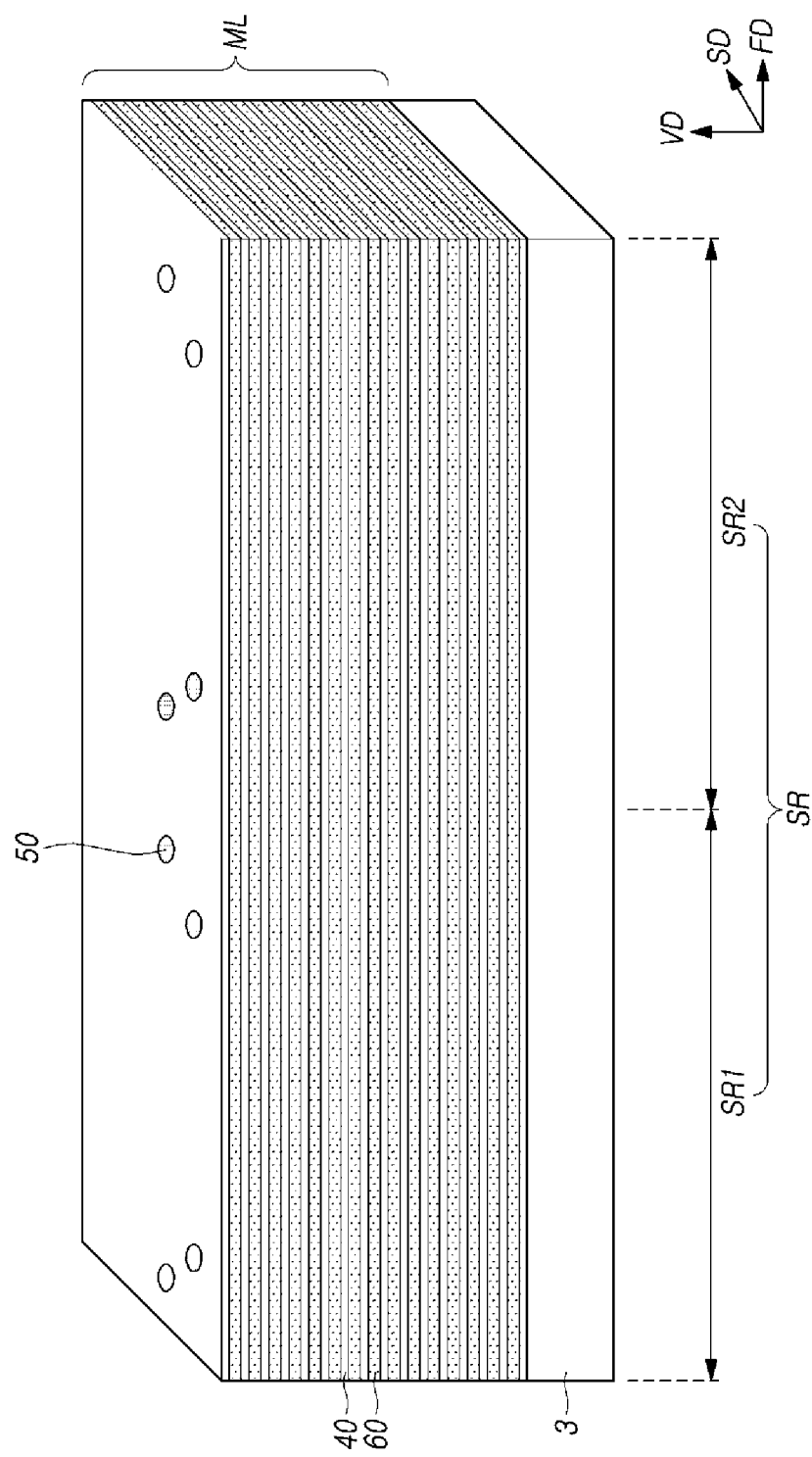

Referring to FIGS. 6A and 6B, first material layers 40 and second material layers 60 may be alternately stacked on a substrate 3, and thereby, a pre-stack ML may be formed.

The first material layers 40 and the second material layers 60 may be formed of different materials. For example, the first material layers 40 may be formed of a dielectric material for interlayer dielectric layers, and the second material layers 60 may be formed of a dielectric material that is used in sacrificial layers and has an etching selectivity with respect to the first material layers 40. The first material layers 40 may be formed of an oxide, for example, silicon oxide, and the second material layers 60 may be formed of a nitride, for example, silicon nitride.

Dielectric supports 50 may be formed by filling vertical holes, which pass through the pre-stack ML in the vertical direction VD, with a dielectric material. The dielectric supports 50 may be formed of a material that has an etching selectivity with respect to the sacrificial layers 60. For example, if the sacrificial layers 60 are formed of a nitride, then the dielectric supports 50 may be formed of an oxide. The dielectric supports 50 may be formed of the same material as the interlayer dielectric layers 40.

Figure 7B:
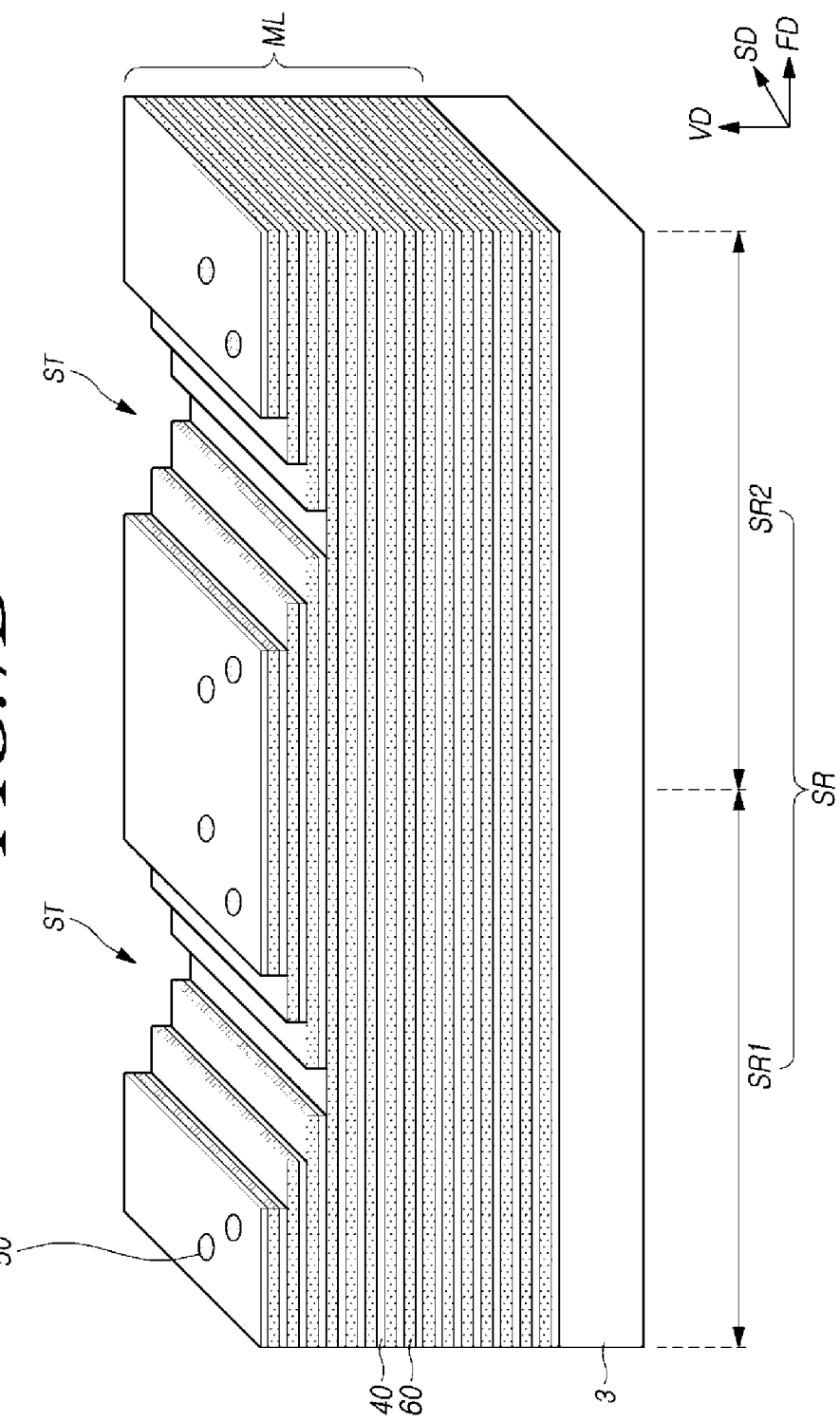

Referring to FIGS. 7A and 7B, a stairway structure ST may be formed on the top of the pre-stack ML in each of a first region SR1 and a second region SR2.

The stairway structures ST may be formed through processes to be described below.

A line type mask pattern (not illustrated), having a line type opening that exposes, in each of the first and second regions SR1 and SR2, the pre-stack ML in the form of a line extending in the second direction SD, is formed on the pre-stack ML. Then, the stairway structures ST may be formed by alternately and repeatedly performing a unit etching process of etching the pre-stack ML to a first etch depth using the line type mask pattern as an etch barrier and a trimming process of increasing the width of the line type opening in the first direction FD. The first etch depth may be the same as the vertical pitch of the second material layers 60.

The line type mask pattern may be formed using a photolithography process, and may be removed after the stairway structures ST are formed.

Figure 8A:
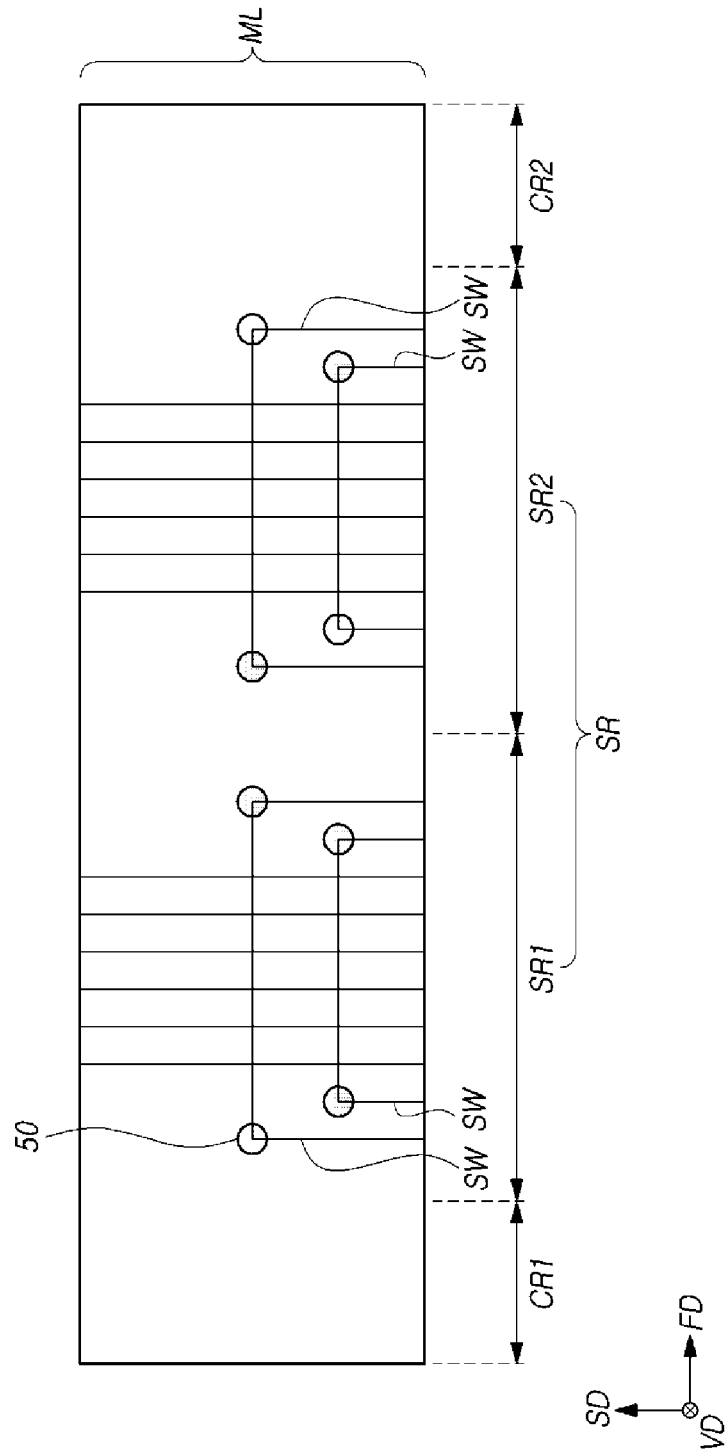
Figure 8B:
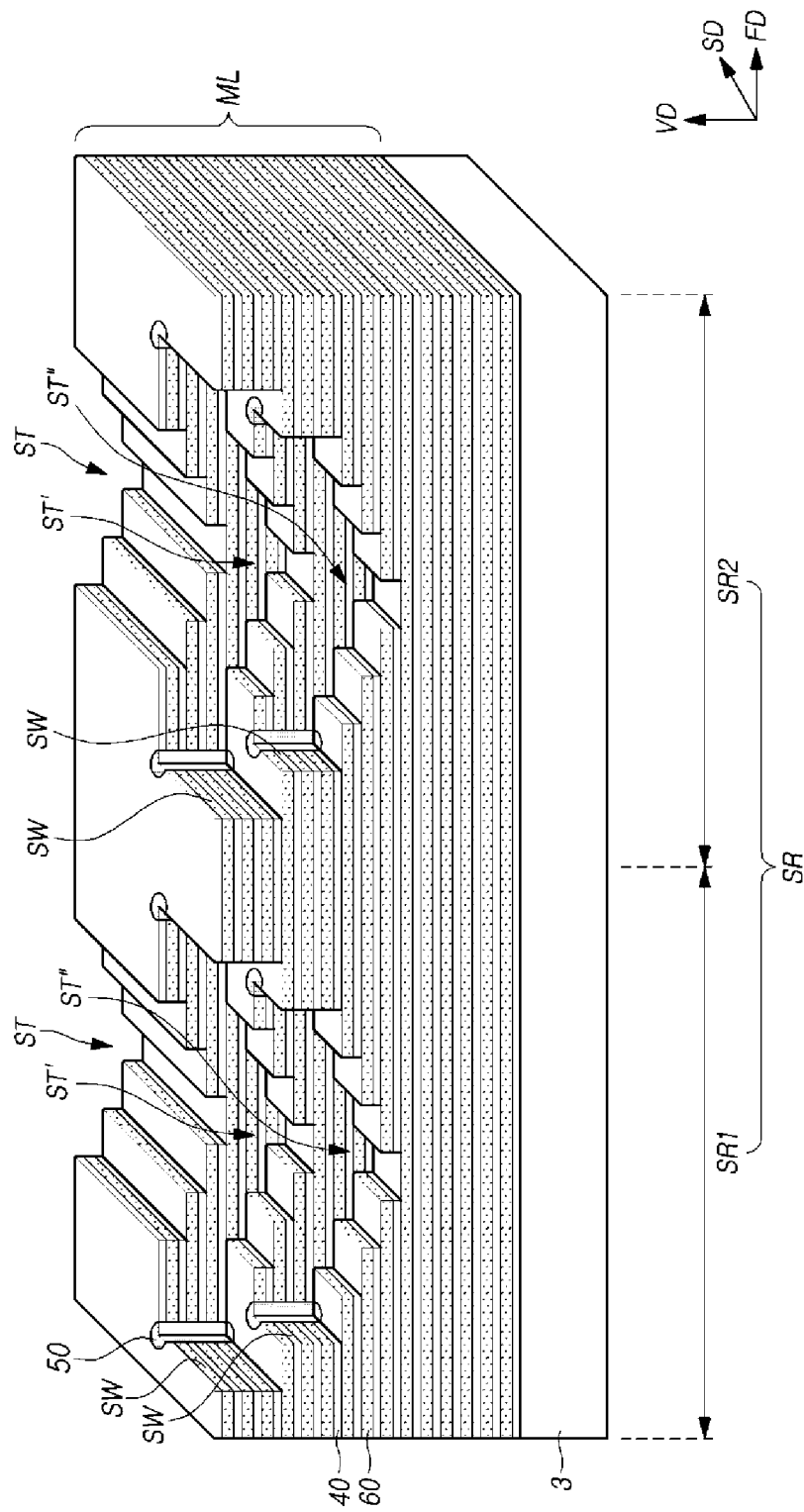

Referring to FIGS. 8A and 8B, in each of the first region SR1 and the second region SR2, a part of the stairway structure ST may be transferred downward in multiple stages, and thereby, stairway structures ST' and ST", which are positioned at different heights, may be formed.

In detail, a first hole type mask pattern (not illustrated) having opening holes that open portions of the stairway structures ST, respectively, is formed on the pre-stack ML, which is formed with the stairway structures ST. Each opening hole may have a shape that traverses the stairway structure ST in the first direction FD. The length of the opening hole in the second direction SD may be shorter than the length of the stairway structure ST in the second direction SD, and the width of the opening hole in the first direction FD may be larger than the width of the stairway structure ST in the first direction FD.

The stairway structures ST' of a first stage are formed by a first pad etching process of etching the pre-stack ML to a second etch depth using the first hole type mask pattern as an etch barrier and thereby transferring the stairway structures ST downward. Sidewalls SW may be formed in the pre-stack ML by the first pad etching process. The height of each of the sidewalls SW may correspond to the difference in height between the top of the upper stairway structure ST and the top of the lower stairway structure sr.

After performing a trimming process of widening the widths and the lengths of the opening holes in the first direction FD and the second direction SD, the stairway structures ST" of a second stage are formed by a second pad etching process using the trimmed first hole type mask pattern as an etch barrier. Sidewalls SW may be additionally formed in the pre-stack ML by the second pad etching process. The height of each of the sidewalls SW may correspond to the difference in height between the top of the upper stairway structure ST' and the top of the lower stairway structure ST".

Each of the sidewalls SW formed by the first and second pad etching processes may have at least one corner portion. The corner portions of the sidewalls SW may be aligned with the dielectric supports 50, respectively. During the first and second pad etching processes, the dielectric supports 50 may be etched together with the pre-stack ML, and may be positioned at the corner portions of the sidewalls SW. The sacrificial layers 60 may be isolated from the corner portions of the sidewalls SW by the dielectric supports 50 positioned at the corner portions of the sidewalls SW.

The first hole type mask pattern may be formed using a photolithography process, and may be removed after the stairway structures ST' and ST" are formed.

Figure 9A:
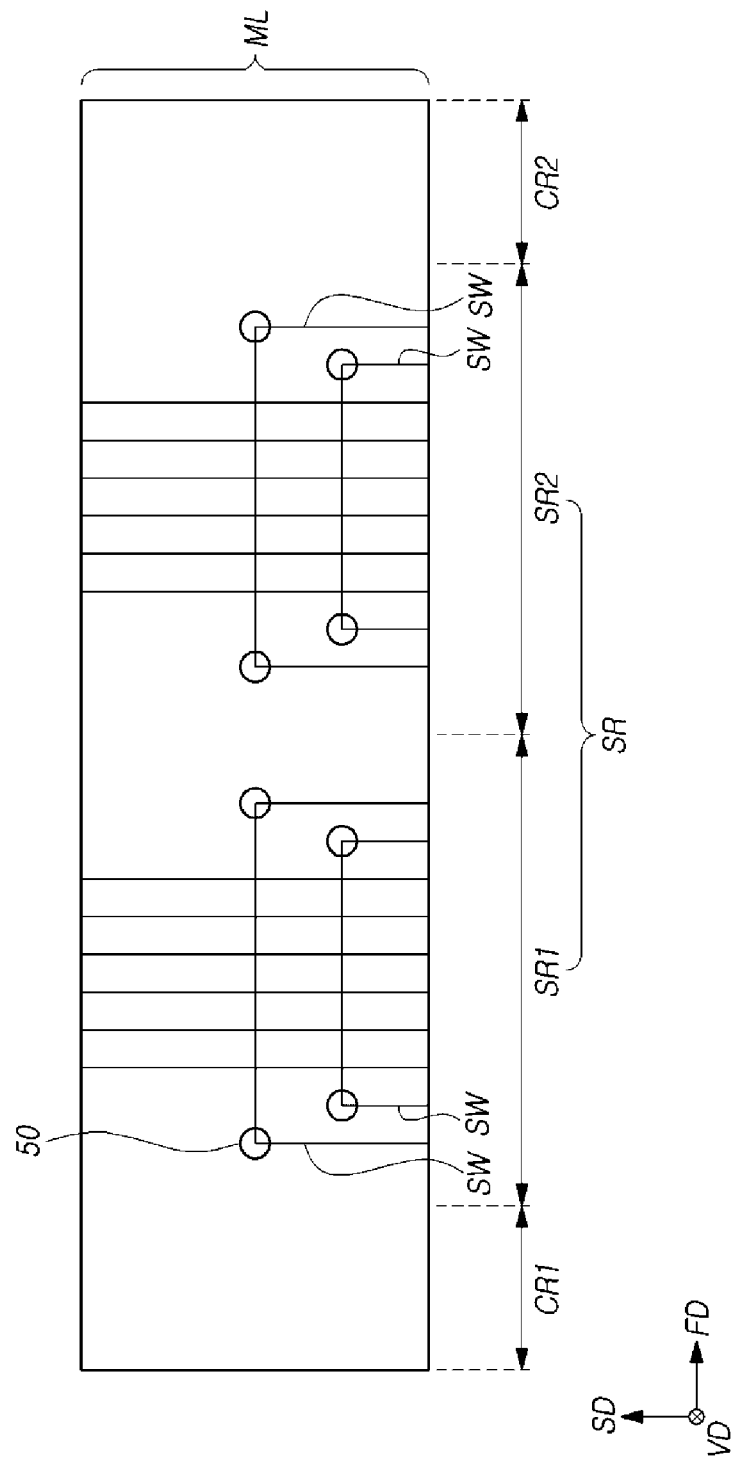
Figure 9B:
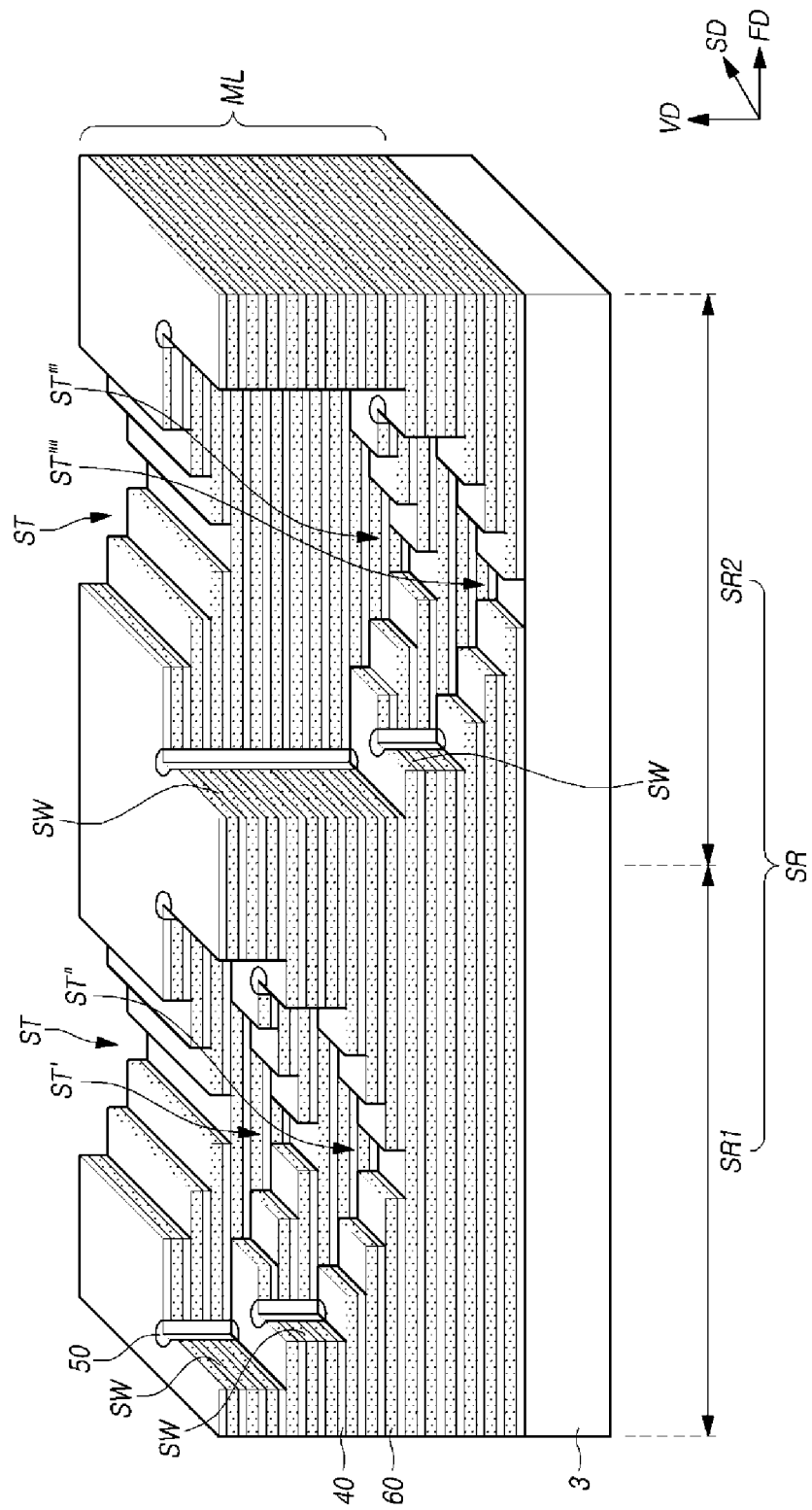

Referring to FIGS. 9A and 9B, the stairway structures ST' and ST" formed in the second region SR2 may be transferred downward, and thereby, stairway structures ST'" and ST"" may be formed.

The stairway structures ST'" and ST"" may be formed through processes to be described below.

A second hole type mask pattern (not illustrated) having an opening hole that opens the stairway structures ST' and ST" of the second region SR2 is formed on the pre-stack ML. The pre-stack ML is etched using the second hole type mask pattern as an etch barrier. The second hole type mask pattern may be formed using a photolithography process, and may be removed after the stairway structures ST'" and ST"" are formed.

Then, although not illustrated, after the second material layers 60, which are used as sacrificial layers, are removed, electrode layers (10a to 10c, 20a to 20c and 30a to 30c of FIG. 5) are formed by filling an electrode material in spaces that are created due to the removal of the second material layers 60.

Hereunder, effects according to embodiments of the disclosure will be described.

In the etching processes for forming the stairway structures ST' to ST"", there is a high possibility that an etching residue is produced near a triple point where the corner portion of the sidewall SW and a bottom surface lying thereunder meet. A large amount of a nitride, which forms the second material layers 60 used as sacrificial layers, may be included in the etching residue. Due to this fact, as the nitride included in the etching residue is substituted with the electrode material during the process of substituting the sacrificial layers with electrode layers, a conductive pattern may be formed near the triple point. Therefore, a failure may occur where electrode layers are positioned at the corner portion of the sidewall SW because upper and lower electrodes may be shorted by the conductive pattern.

According to embodiments disclosed herein, by forming the dielectric support 50 at a position where the corner portion of the sidewall SW is to be formed, and thereby isolating the electrode layers 10a to 10c, 20a to 20c and 30a to 30c from the corner portion of the sidewall SW, it is possible to prevent the occurrence of a failure due to the short of the upper and lower electrodes, even though a conductive pattern is formed near a triple point.

Figure 10:
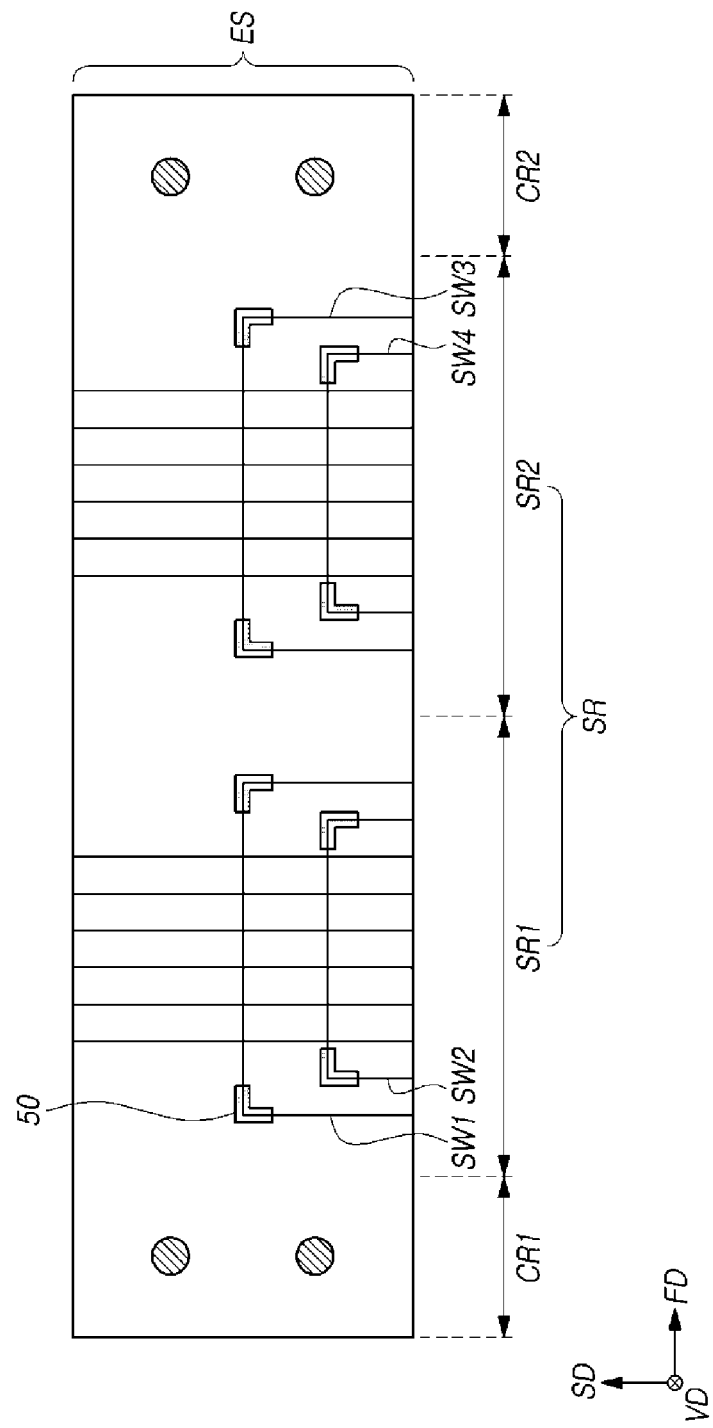
FIG. 10 is a top view illustrating a representation of a dielectric support in accordance with another embodiment of the disclosure.

FIG. 10 is a top view illustrating a representation of a dielectric support in accordance with another embodiment of the disclosure.

Referring to FIG. 10, a dielectric support 50 may have a structure corresponding to the shape of the corner portions of sidewalls SW1 to SW4 when viewed from the top. For example, the dielectric support 50 may also have an L-shape where the corner portions of the sidewalls SW1 to SW4 each have an L-shape when viewed from the top.

Figure 11:
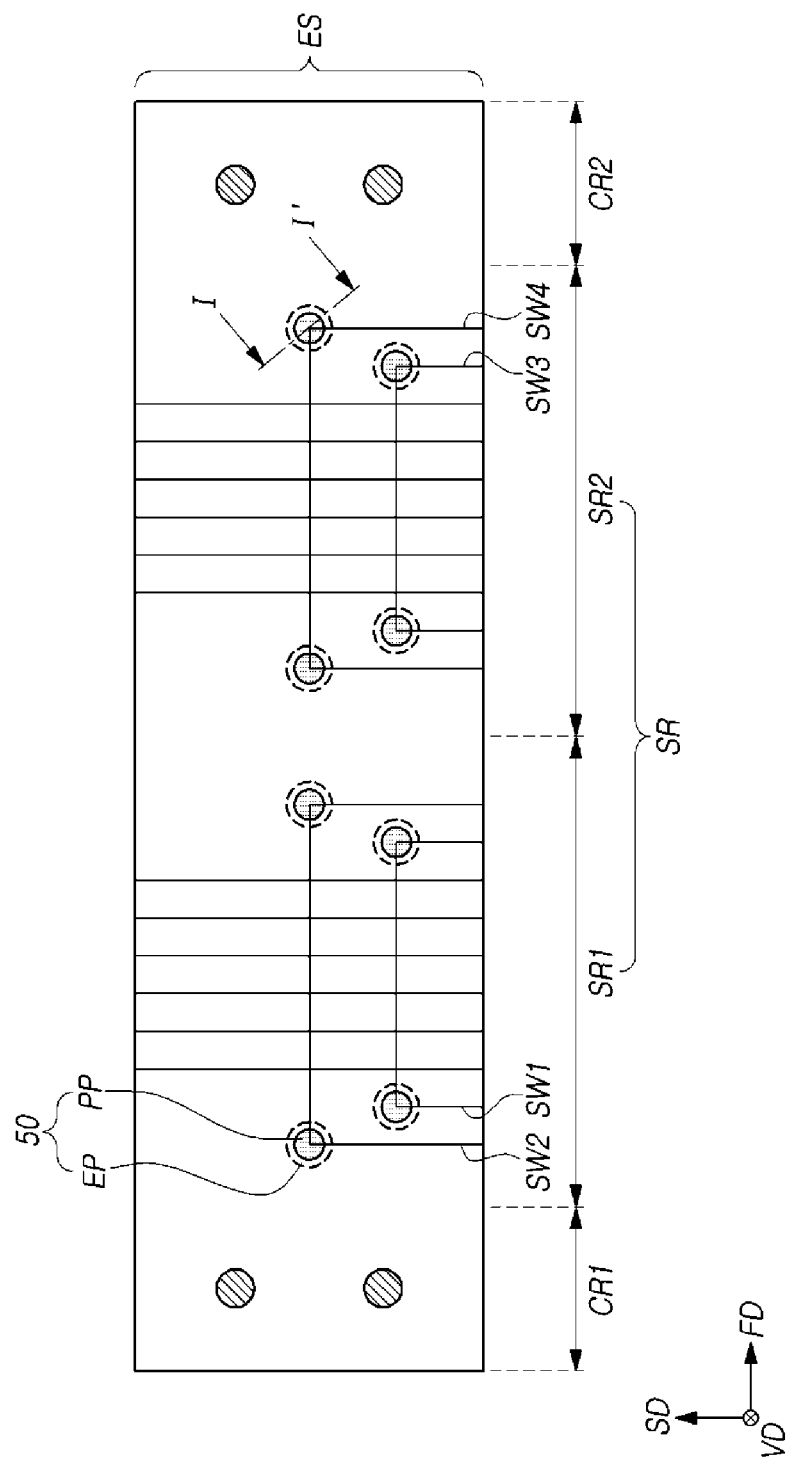
FIG. 11 is a top view illustrating a representation of a dielectric support in accordance with still another embodiment of the disclosure.
Figure 12:
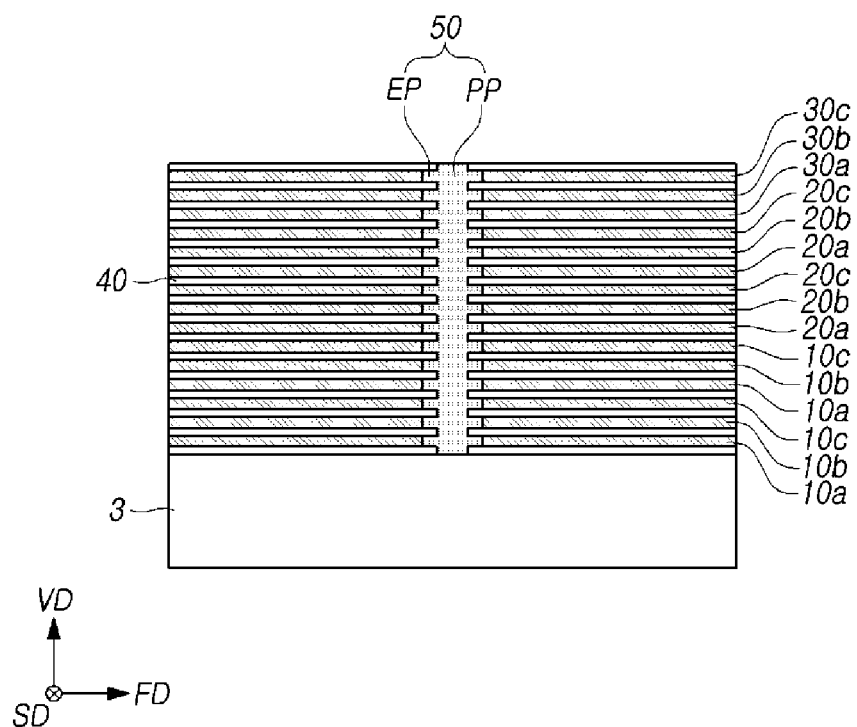
FIG. 12 is a cross-sectional view taken along the line I-I' of FIG. 11.

FIG. 11 is a top view illustrating a representation of a dielectric support in accordance with still another embodiment of the disclosure, and FIG. 12 is a cross-sectional view taken along the line I-I' of FIG. 11.

Referring to FIGS. 11 and 12, each of a dielectric support 50 may include a pillar PP and a plurality of horizontal dielectric layers EP. The pillar PP may pass through an electrode structure ES in the vertical direction VD at the corner portion of each of sidewalls SW1 to SW4.

Each of the horizontal dielectric layers EP may extend in a horizontal direction parallel to a plane, defined by the first direction FD and the second direction SD, from the outer circumferential surface of the pillar PP between interlayer dielectric layers 40. The horizontal dielectric layers EP may be disposed at the same layers as electrode layers 10a to 10c, 20a to 20c and 30a to 30c, respectively. The plurality of horizontal dielectric layers EP may be stacked alternately with the plurality of interlayer dielectric layers 40 around the pillar PP.

Because the dielectric supports 50 include the horizontal dielectric layers EP, the gap between the electrode layers 10a to 10c, 20a to 20c and 30a to 30c and the corner portions of the sidewalls SW1 to SW4 may be increased by the width of the horizontal dielectric layers EP in the horizontal direction.

Figure 13A:
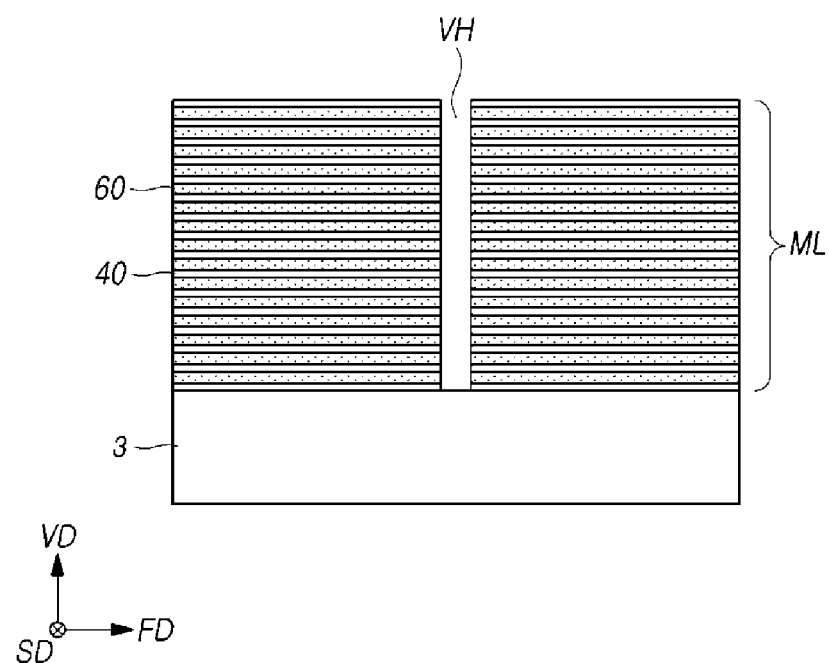
FIGS. 13A to 13C are representations of cross-sectional views to assist in the explanation of a method for forming the dielectric support illustrated in FIGS. 11 and 12.
Figure 13B:
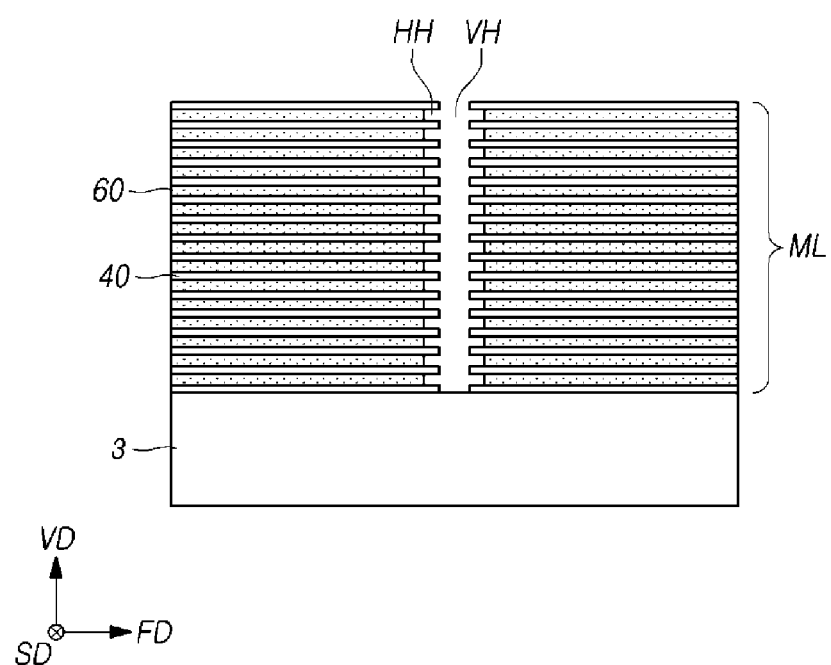
Figure 13C:
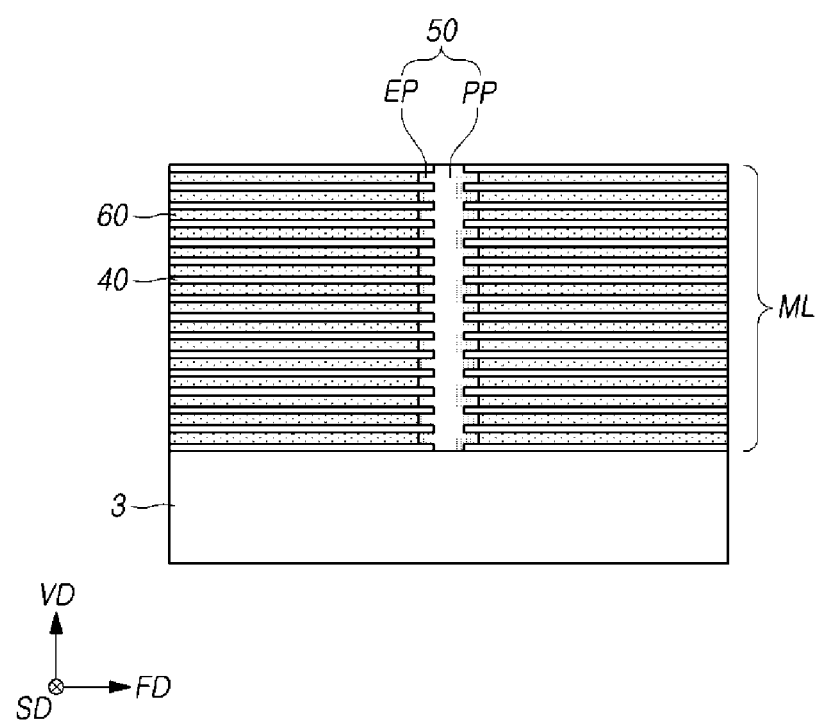

FIGS. 13A to 13C are representations of cross-sectional views to assist in the explanation of a method for forming the dielectric support illustrated in FIGS. 11 and 12.

Referring to FIG. 13A, after first material layers 40 and second material layers 60 are alternately stacked on a substrate 3 and thereby a pre-stack ML is formed, a vertical hole VH may be formed that passes through the pre-stack ML.

Referring to FIG. 13B, the second material layers 60 around the vertical hole VH may be removed, and thereby, a plurality of horizontal grooves HH may be formed. A process of forming the horizontal grooves HH may be performed to inject an etching material (e.g., an etchant), capable of removing the second material layers 60, into the vertical hole VH. The horizontal grooves HH may extend from the sidewall of the vertical hole VH in a horizontal direction parallel to a plane defined by the first direction FD and the second direction SD.

Referring to FIG. 13C, as a dielectric material is filled in the vertical hole VH and the horizontal grooves HH, a dielectric support 50 may be formed. The portion of dielectric support 50 filled in the vertical hole VH may correspond to a pillar PP, and the portion of dielectric support 50 filled in the horizontal grooves HH may correspond to horizontal dielectric layers EP.

Figure 14:
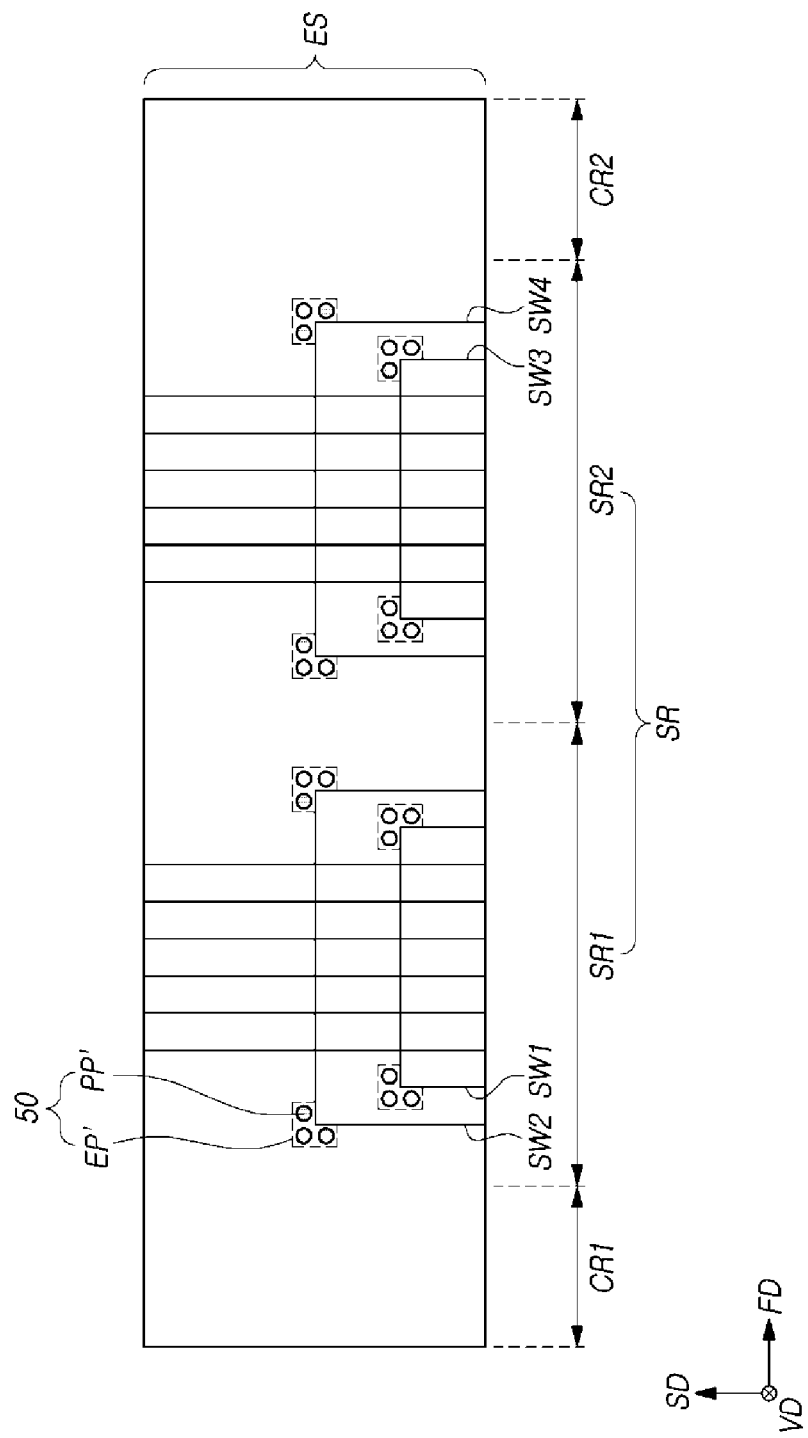
FIG. 14 is a top view illustrating a representation of an example of a dielectric support in accordance with yet another embodiment of the disclosure.
Figure 15:
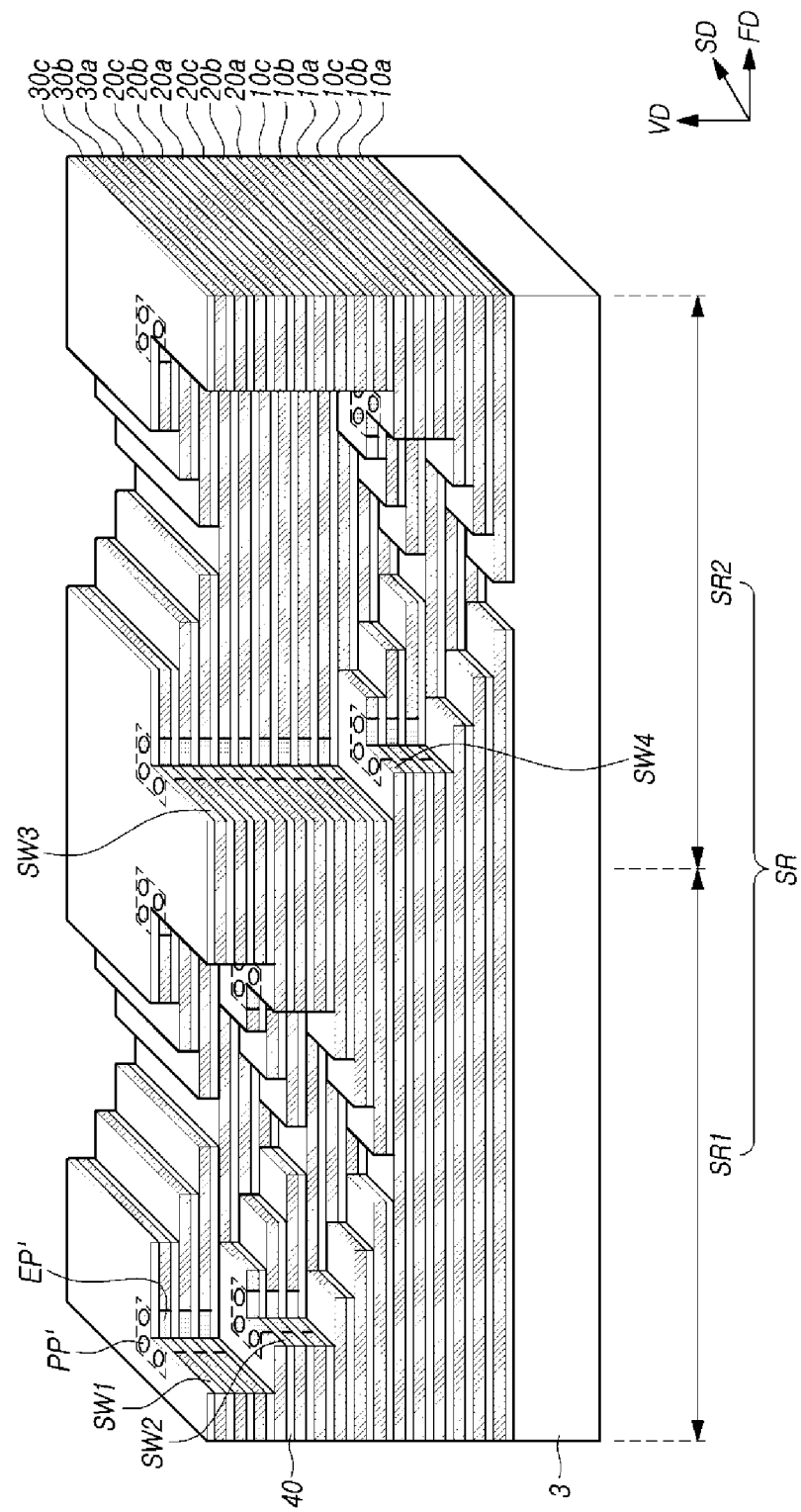
FIG. 15 is a perspective view illustrating a representation of a part of FIG. 14.

FIG. 14 is a top view illustrating a representation of a dielectric support in accordance with yet another embodiment of the disclosure, and FIG. 15 is a perspective view illustrating a representation of a part of FIG. 14.

Referring to FIGS. 14 and 15, each of dielectric supports 50 may include a pillar PP' and a plurality of horizontal dielectric layers EP'. The pillar PP' may pass through an electrode structure ES in the vertical direction VD in the vicinity of or near the corner portion of each of sidewalls SW1 to SW4. Although the present embodiment illustrates three pillars PP' that are formed at each corner portion, the disclosure is not limited thereto. One or at least two pillars PP' may be formed at each corner portion.

Each of the horizontal dielectric layers EP' may extend in a horizontal direction from the outer circumferential surface of the pillar PP' between interlayer dielectric layers 40. The horizontal dielectric layers EP' may be disposed at the same layers as electrode layers 10a to 10c, 20a to 20c and 30a to 30c, respectively. At the corner portion, the plurality of horizontal dielectric layers EP' may be disposed alternately with the plurality of interlayer dielectric layers 40 around the pillars PP'.

FIGS. 16A to 21B are representations of views to assist in the explanation of a method for manufacturing a three-dimensional memory device including the dielectric support illustrated in FIGS. 14 and 15. In detail, FIGS. 16A to 21A are representations of top views to assist in the explanation of steps of a method for manufacturing a three-dimensional memory device, and FIGS. 16B to 21B are representations of perspective views to assist in the explanation of steps of a method for manufacturing a three-dimensional memory device.

Figure 16B:
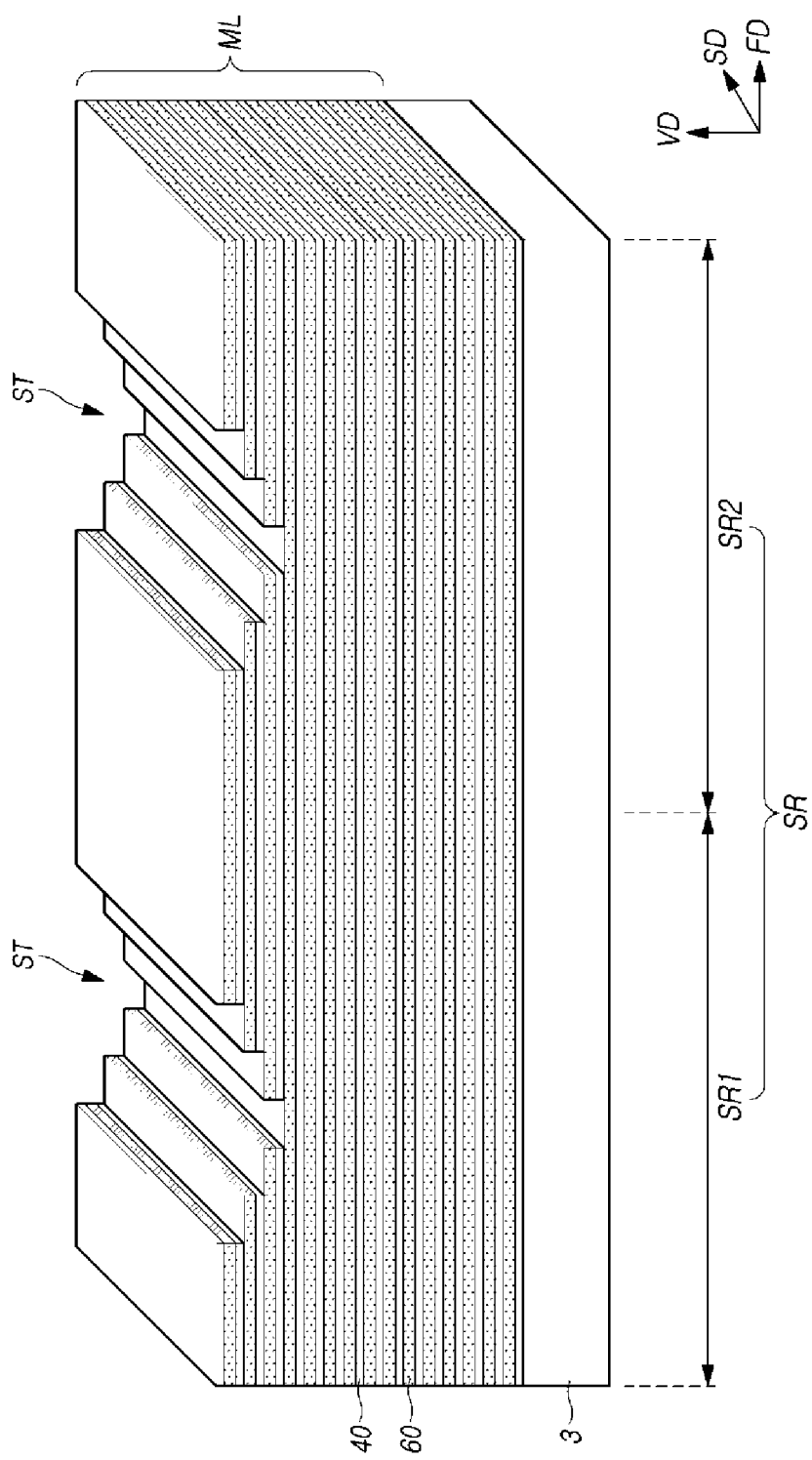

Referring to FIGS. 16A and 16B, first material layers 40 and second material layers 60 may be alternately stacked on a substrate 3, and thereby, a pre-stack ML may be formed. Stairway structures ST may be formed on the top of the pre-stack ML in a first region SR1 and a second region SR2, respectively.

Referring to FIGS. 17A and 17B, in each of the first region SR1 and the second region SR2, a part of the stairway structure ST may be transferred downward by an etching process, and thereby, stairway structures ST' and ST", which are positioned at different heights, may be formed. Due to differences in height among the stairway structures ST, ST' and ST", a plurality of sidewalls SW may be formed in the pre-stack ML.

Figure 18A:
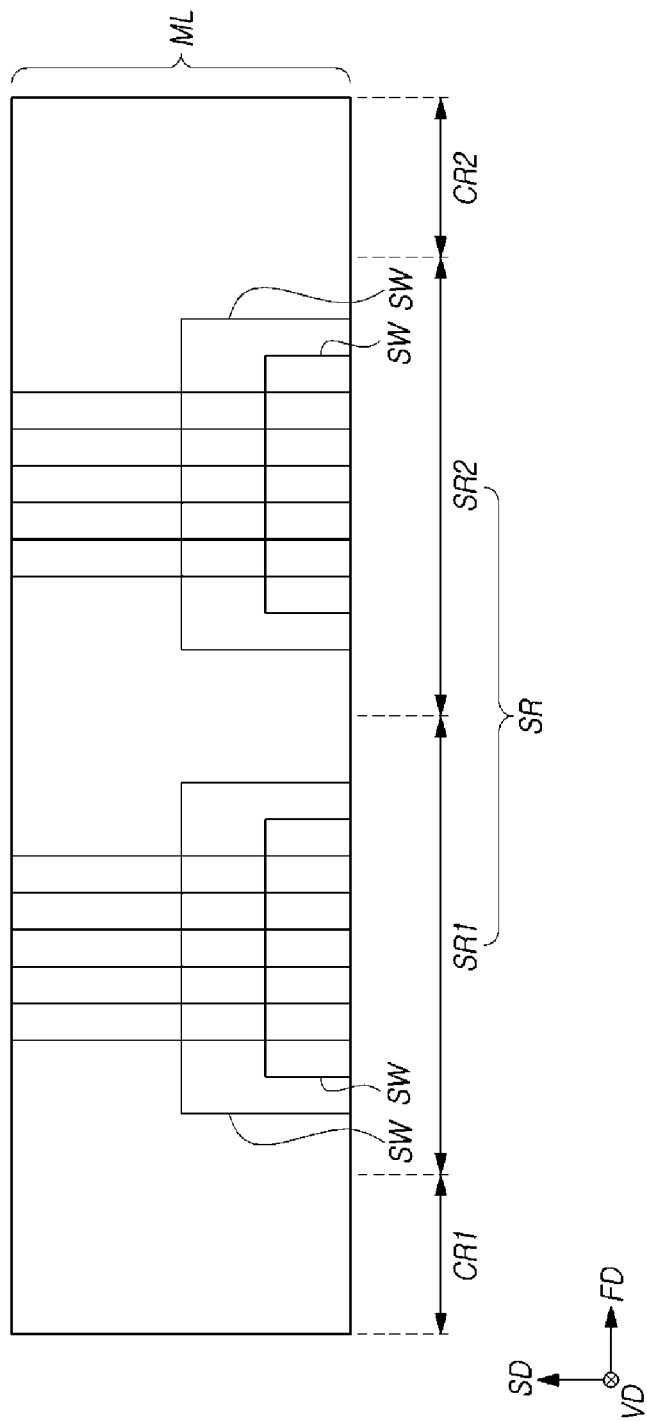
Figure 18B:
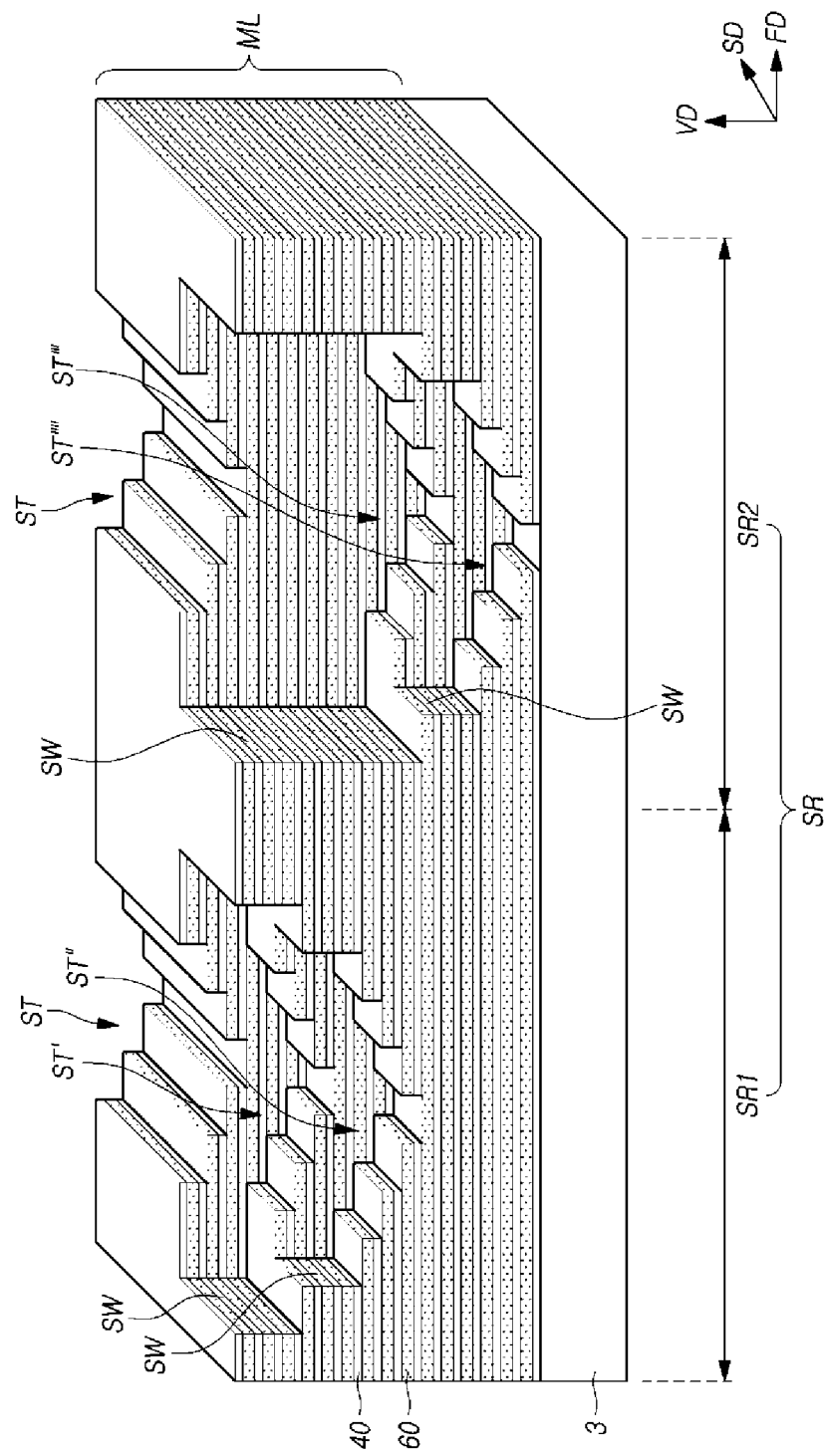

Referring to FIGS. 18A and 18B, the stairway structures ST' and ST" formed in the second region SR2 may be transferred downward by an etching process, and thereby, stairway structures ST'" and ST"" may be formed. A plurality of sidewalls SW may be formed in the pre-stack ML with different heights among the stairway structures ST, ST', ST", ST'" and ST"".

Figure 19A:
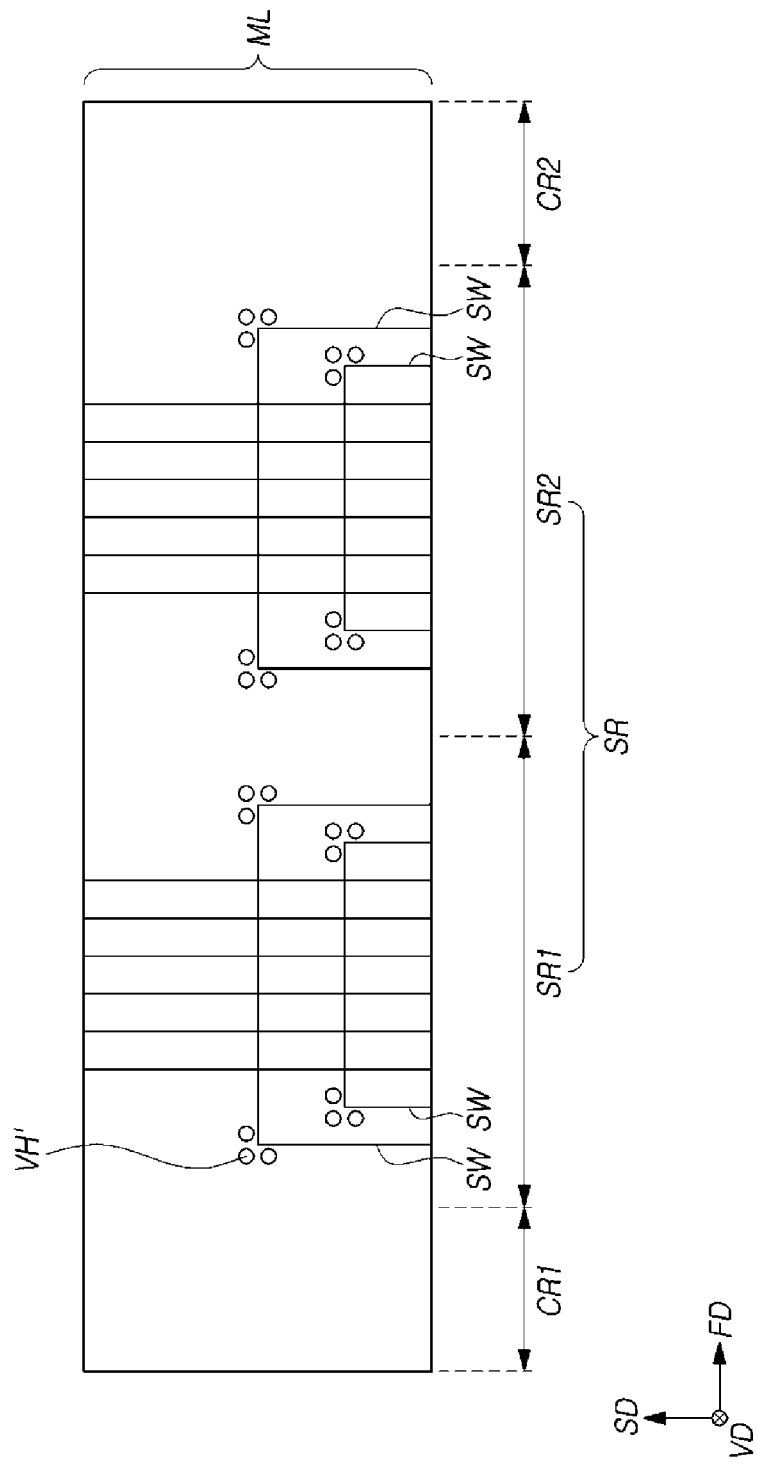
Figure 19B:
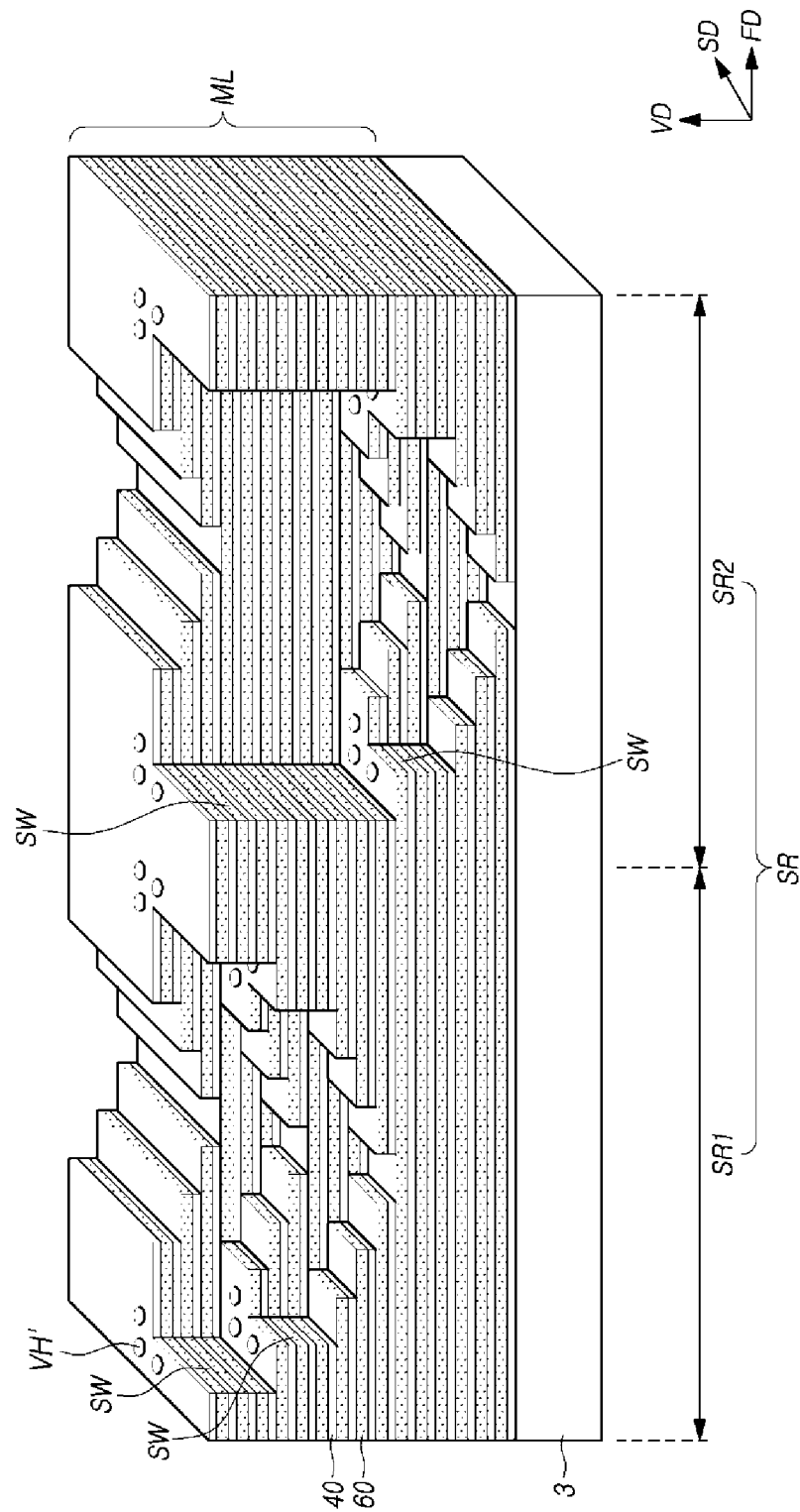

Referring to FIGS. 19a and 19b, a plurality of vertical holes VH', which pass through the pre-stack ML in the vertical direction VD, may be formed in regions that are adjacent to the corner portions of the sidewalls SW. Although the present embodiment illustrates three vertical holes VH' formed at each corner portion, the disclosure is not limited thereto. One or at least two vertical holes VH' may be formed at each corner portion.

Figure 20B:
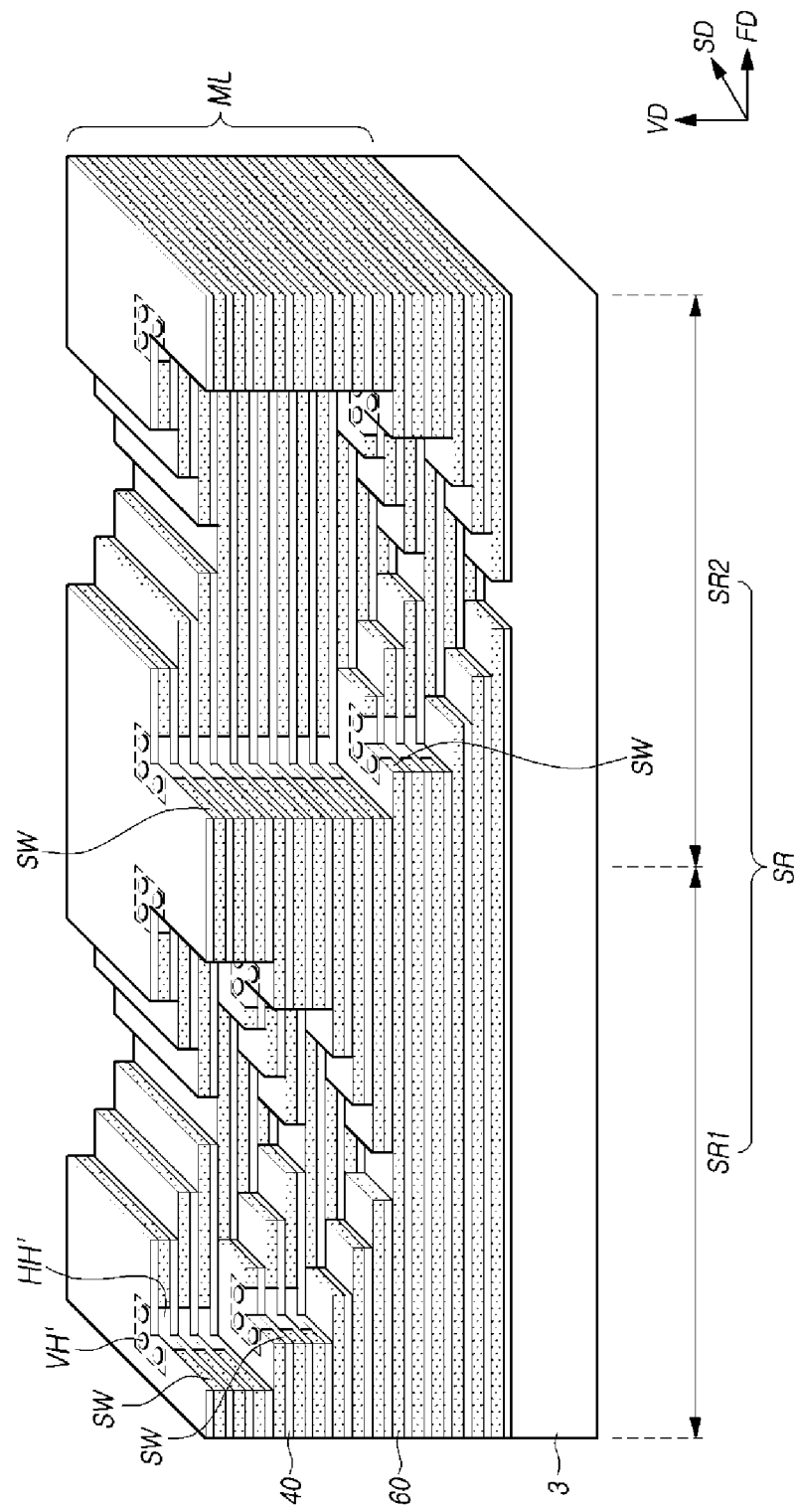

Referring to FIGS. 20A and 20B, as the second material layers 60 formed at the corner portion are removed through the vertical hole VH', a plurality of horizontal grooves HH' may be formed.

A process of forming the horizontal grooves HH' may be performed to inject an etching material (e.g., an etchant), capable of removing the second material layers 60, into the vertical hole VH'. The horizontal grooves HH' may extend from the sidewalls of the vertical holes VH' in a direction parallel to a plane defined by the first direction FD and the second direction SD, and may be coupled to the corner portions of the sidewalls SW. Accordingly, the second material layers 60 formed at the corner portions may be removed.

Figure 21B:
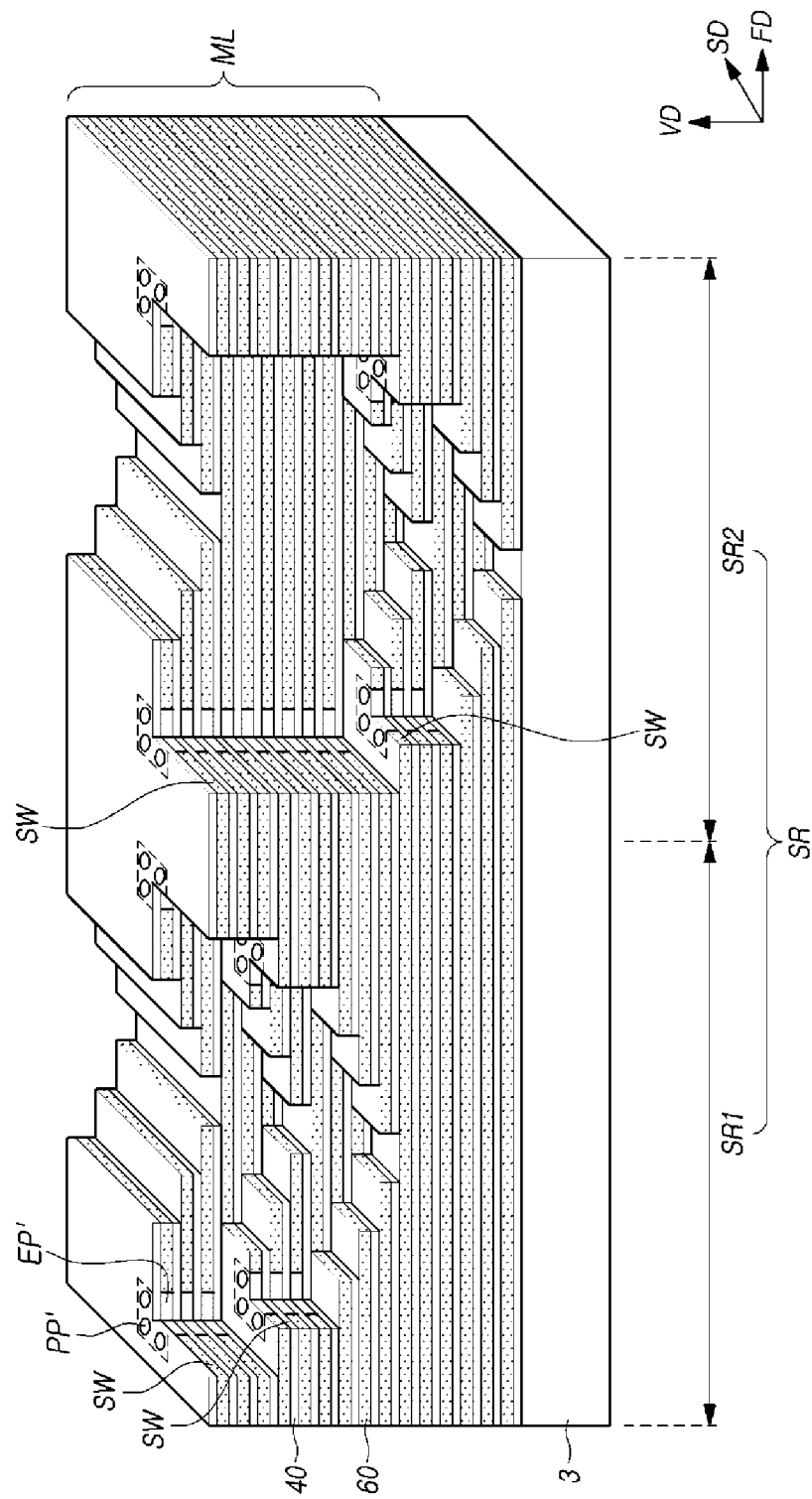

Referring to FIGS. 21A and 21B, as a dielectric material is filled in the vertical hole VH' and the horizontal grooves HH', a dielectric support 50 may be formed. The portion of dielectric support 50 filled in the vertical hole VH' may correspond to a pillar PP', and the portion of dielectric support 50 filled in the horizontal grooves HH' may correspond to horizontal dielectric layers EP'.

Then, although not illustrated, after the second material layers 60 used as sacrificial layers are removed, by filling an electrode material in spaces that are created due to the removal of the second material layers 60, electrode layers (10a to 10c, 20a to 20c and 30a to 30c of FIG. 15) are formed.

Figure 22:
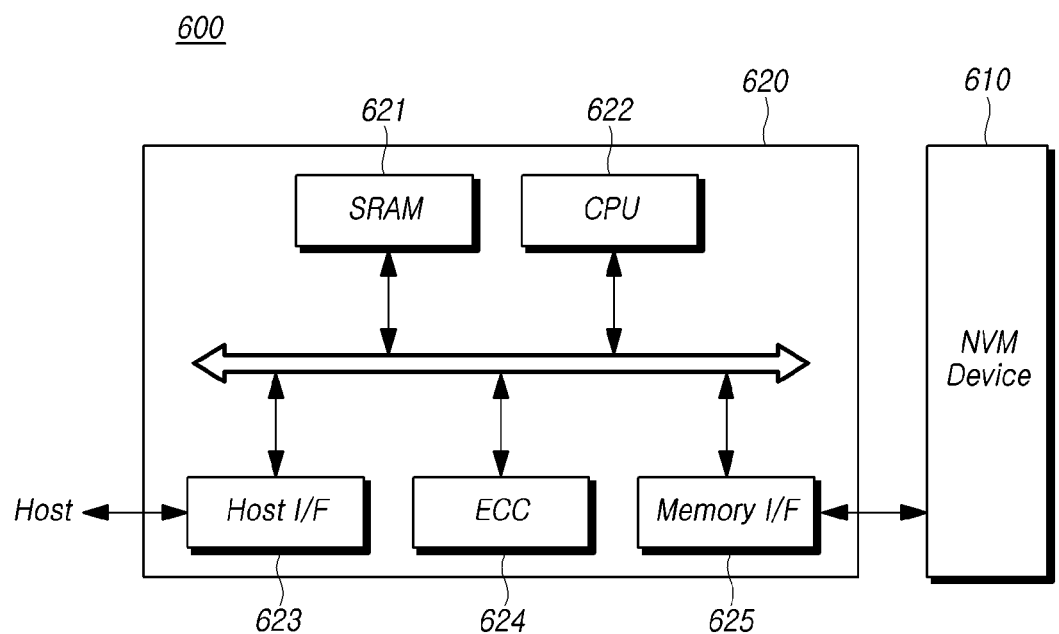
FIG. 22 is a block diagram schematically illustrating a representation of a memory system including a memory device in accordance with an embodiment of the disclosure.

FIG. 22 is a block diagram schematically illustrating a representation of a memory system including a memory device in accordance with an embodiment of the disclosure.

Referring to FIG. 22, a memory system 600 in accordance with an embodiment may include a nonvolatile memory device (NVM Device) 610 and a memory controller 620.

The nonvolatile memory device (NVM Device) 610 may be constituted by the memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 23:
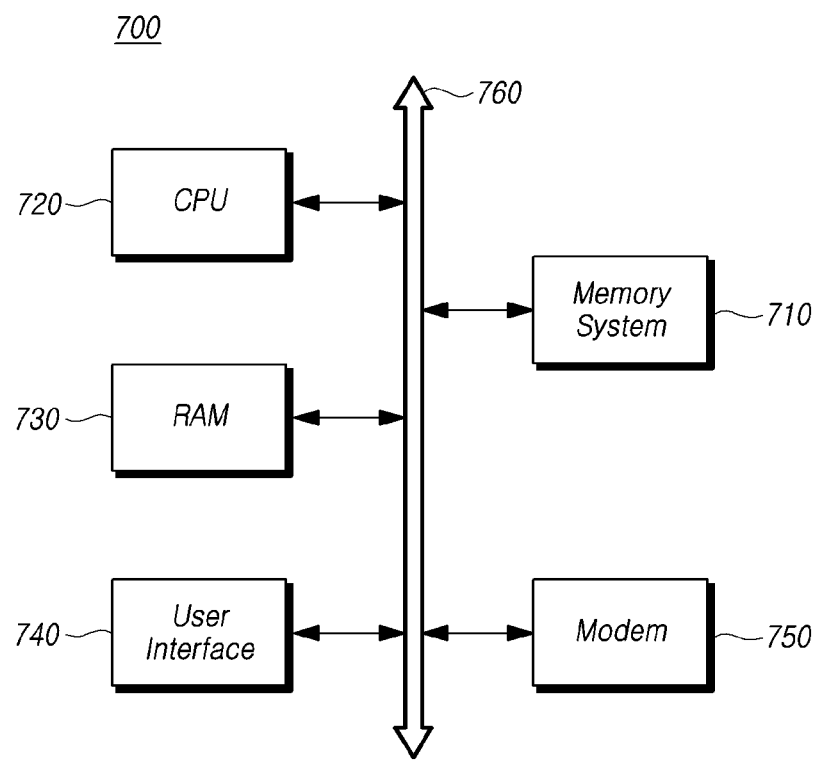
FIG. 23 is a block diagram schematically illustrating a representation of a computing system including a memory device in accordance with an embodiment of the disclosure.

FIG. 23 is a block diagram schematically illustrating a representation of a computing system including a memory device in accordance with an embodiment of the disclosure.

Referring to FIG. 23, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A three-dimensional memory device comprising:
    an electrode structure including a plurality of electrode layers and a plurality of interlayer dielectric layers, which are alternately stacked on a substrate;
    a first stairway structure and a second stairway structure, defined in the electrode structure, and positioned at different heights with respect to a top surface of the substrate from each other;
    a sidewall of the electrode structure between the first stairway structure and the second stairway structure; and
    a dielectric support passing through the electrode structure and isolating a corner portion of the sidewall from the plurality of electrode layers.

2. The three-dimensional memory device of claim 1, wherein the dielectric support is formed of the same material as the plurality of interlayer dielectric layers.

3. The three-dimensional memory device of claim 1, wherein the dielectric support includes an oxide.

4. The three-dimensional memory device of claim 1, wherein the dielectric support comprises a pillar that passes through the electrode structure at the corner portion.

5. The three-dimensional memory device of claim 1, wherein the dielectric support has a shape corresponding to a shape of the corner portion when viewed from the top.

6. The three-dimensional memory device of claim 1, wherein the dielectric support comprises:
    a vertical pillar passing through the electrode structure at the corner portion; and
    a plurality of horizontal dielectric layers extending from an outer circumferential surface of the vertical pillar, and disposed alternately with the plurality of interlayer dielectric layers around the vertical pillar.

7. The three-dimensional memory device of claim 1, wherein the dielectric support comprises:
a pillar passing through the electrode structure near the corner portion; and
a plurality of horizontal dielectric layers extending from an outer circumferential surface of the pillar, and disposed alternately with the plurality of interlayer dielectric layers at the corner portion.

8. The three-dimensional memory device of claim 1,
wherein each of the first and second stairway structures includes a plurality of steps, each of which has a height that is the same as a vertical pitch of the electrode layers, and
wherein a height of the sidewall corresponds to K times the vertical pitch of the electrode layers, and K is a natural number of two or greater.

9. A method for manufacturing a three-dimensional memory device, comprising:
forming a pre-stack by alternately stacking a plurality of interlayer dielectric layers and a plurality of sacrificial layers on a substrate;
forming a dielectric support, which passes through the pre-stack;
forming a first stairway structure on a top of the pre-stack in a slimming region;
forming a second stairway structure by transferring a part of the first stairway structure downward by etching the pre-stack; and
substituting the sacrificial layers with electrode layers,
wherein, in the forming of the second stairway structure, a corner portion of a sidewall that is formed in the pre-stack by the etching is isolated from the plurality of sacrificial layers by the dielectric support.

10. The method of claim 9, wherein the dielectric support is formed of a material which has an etching selectivity with respect to the sacrificial layers.

11. The method of claim 9, wherein the sacrificial layers include a nitride, and the dielectric support includes an oxide.

12. The method of claim 9, wherein the forming of the dielectric support comprises:
forming a vertical hole that passes through the pre-stack; and
filling a dielectric material in the vertical hole.

13. The method of claim 9, wherein the dielectric support is formed into a shape corresponding to a shape of the corner portion when viewed from the top.

14. The method of claim 9, wherein the forming of the dielectric support comprises:
forming a vertical hole that passes through the pre-stack;
forming a plurality of horizontal grooves by removing the sacrificial layers around the vertical hole; and
filling a dielectric material in the vertical hole and the plurality of horizontal grooves.

15. A method for manufacturing a three-dimensional memory device, comprising:
forming a pre-stack by alternately stacking a plurality of interlayer dielectric layers and a plurality of sacrificial layers on a substrate;
forming a first stairway structure on a top of the pre-stack;
forming a second stairway structure by transferring a part of the first stairway structure downward by etching the pre-stack;
forming a vertical hole which passes through the pre-stack, in the vicinity of a corner portion of a sidewall, which is formed in the pre-stack in the forming of the second stairway structure;
forming a plurality of horizontal grooves by removing the plurality of sacrificial layers, formed at the corner portion, through the vertical hole;
forming a dielectric support in the vertical hole and the plurality of horizontal grooves; and
substituting the sacrificial layers with electrode layers.

16. The method of claim 15, wherein the dielectric support is formed of a material which has an etching selectivity with respect to the sacrificial layers.

17. The method of claim 15, wherein the sacrificial layers include a nitride, and the dielectric support includes an oxide.

18. The method of claim 15, wherein the dielectric support has an L-shape corresponding to a shape of the corner portion when viewed from the top.

19. The method of claim 18, wherein the dielectric support comprises at least one pillar.

20. The method of claim 19, wherein the dielectric support further comprises a plurality of horizontal dielectric layers extending from an outer circumferential surface of the at least one pillar to the fill the L-shape.

* * * * *